US012672533B2

(12) United States Patent
Choi et al.

(10) Patent No.: US 12,672,533 B2
(45) Date of Patent: Jun. 30, 2026

(54) SEMICONDUCTOR DEVICE

(71) Applicant: SAMSUNG ELECTRONICS CO., LTD., Suwon-si (KR)

(72) Inventors: Da Woon Choi, Suwon-si (KR); Bongkeun Kim, Suwon-si (KR); Myung Soo Noh, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 448 days.

(21) Appl. No.: 18/511,607

(22) Filed: Nov. 16, 2023

(65) Prior Publication Data

US 2024/0339379 A1     Oct. 10, 2024

(30) Foreign Application Priority Data

Apr. 6, 2023     (KR) ........................ 10-2023-0045413

(51) Int. Cl.
| | |
|---|---|
| *H10W 20/20* | (2026.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC .......... *H10W 20/20* (2026.01); *H10D 30/014* (2025.01); *H10D 30/43* (2025.01); *H10D 30/6729* (2025.01); *H10D 30/6735* (2025.01); *H10D 62/121* (2025.01);

(Continued)

(58) Field of Classification Search
CPC . H10W 20/20; H10W 20/023; H10W 20/424; H10W 20/427; H10W 20/435; H10W 30/014; H10W 30/43; H10W 30/6729; H10W 30/6735; H10W 30/6757; H10D 84/834

See application file for complete search history.

(56) References Cited

U.S. PATENT DOCUMENTS

| | | | |
|---|---|---|---|
| 9,455,187 | B1 | 9/2016 | Gambino et al. |
| 11,177,286 | B2 | 11/2021 | Kim et al. |

(Continued)

FOREIGN PATENT DOCUMENTS

| | | |
|---|---|---|
| CN | 113363226 | 9/2021 |
| KR | 20220104617 | 7/2022 |

*Primary Examiner* — Steven B Gauthier
*Assistant Examiner* — Marc-Anthony Armand
(74) *Attorney, Agent, or Firm* — Fish & Richardson P.C.

(57) ABSTRACT

A semiconductor device includes a substrate, a first active pattern extending in a first horizontal direction, a second active pattern extending in the first horizontal direction and spaced apart from the first active pattern in a second horizontal direction, a gate electrode extending in the second horizontal direction, a source/drain region disposed on a side of the gate electrode, a first through-via disposed inside the substrate between the first and second active patterns, an upper interlayer insulating layer covering the source/drain region, and a second through-via connected to the first through-via by passing through the upper interlayer insulating layer in a vertical direction spaced apart from the source/drain region in the second horizontal direction. A width of the first through-via in the second horizontal direction is continuously reduced as the first through-via becomes adjacent to the lower surface of the substrate.

20 Claims, 47 Drawing Sheets

(51) Int. Cl.
      *H10D 64/01*      (2025.01)
      *H10W 20/00*      (2026.01)
      *H10W 20/41*      (2026.01)

(52) U.S. Cl.
      CPC ........ *H10D 64/017* (2025.01); *H10W 20/023*
      (2026.01); *H10W 20/427* (2026.01); *H10W*
      *20/435* (2026.01)

(56) References Cited

U.S. PATENT DOCUMENTS

| | | |
|---|---|---|
| 11,362,213 B2 | 6/2022 | Ju et al. |
| 11,387,181 B2 | 7/2022 | Chou et al. |
| 11,411,100 B2 | 8/2022 | Wang et al. |
| 2020/0266169 A1 | 8/2020 | Kang et al. |
| 2022/0157737 A1 | 5/2022 | Cho et al. |
| 2022/0301878 A1 | 9/2022 | Xie et al. |
| 2025/0359150 A1* | 11/2025 | Poon .................. H10D 30/6729 |

* cited by examiner

SEMICONDUCTOR DEVICE

CROSS-REFERENCE TO RELATED APPLICATION

This application claims priority from Korean Patent Application No. 10-2023-0045413 filed on Apr. 6, 2023, in the Korean Intellectual Property Office and all the benefits accruing therefrom under 35 U.S.C. 119, the contents of which in its entirety are herein incorporated by reference.

BACKGROUND

As one of the scaling techniques for increasing a density of an integrated circuit device, multi-gate transistors for forming a silicon body having fin or nano-wire shapes on a substrate and forming a gate on a surface of the silicon body have been suggested.

Since this multi-gate transistor uses a three-dimensional channel, it is easy to scale the multi-gate transistor. Also, even though a gate length of the multi-gate transistor is not increased, a current control capability may be improved. In addition, a short channel effect (SCE) in which a potential of a channel region is affected by a drain voltage may be suppressed effectively.

SUMMARY

The present disclosure relates to semiconductor devices, and more particularly, to a semiconductor device that includes a multi-bridge channel field effect transistor (MBCFET), where a thickness of a substrate is stable during a process of forming a first through-via.

The present disclosure also relates to a semiconductor device in which a width of an upper surface of a first through-via disposed inside a substrate is formed to be greater than that of a lower surface of the first through-via so that a second through-via is stably connected to the upper surface of the first through-via.

The advantages of the present disclosure are not limited to those mentioned above and will be clearly understood by those skilled in the art from the following description of the present disclosure.

According to some implementations of the present disclosure, there is provided a semiconductor device, comprising a substrate, a first active pattern extending in a first horizontal direction on an upper surface of the substrate, a second active pattern extending in the first horizontal direction on the upper surface of the substrate, the second active pattern spaced apart from the first active pattern in a second horizontal direction different from the first horizontal direction, a gate electrode extending in the second horizontal direction on the first and second active patterns, a source/drain region disposed on at least one side of the gate electrode on the first active pattern, a first through-via disposed inside the substrate between the first active pattern and the second active pattern, the first through-via spaced apart from each of the first and second active patterns in the second horizontal direction, an upper surface of the first through-via formed on the same plane as the upper surface of the substrate, a lower surface of the first through-via formed on the same plane as a lower surface of the substrate, an upper interlayer insulating layer covering the source/drain region, and a second through-via connected to the first through-via by passing through the upper interlayer insulating layer in a vertical direction, the second through-via spaced apart from the source/drain region in the second horizontal direction, wherein a width of the first through-via in the second horizontal direction is continuously reduced as the first through-via becomes adjacent to the lower surface of the substrate.

According to some implementations of the present disclosure, there is provided a semiconductor device, comprising a substrate, an active pattern extending in a first horizontal direction on an upper surface of the substrate, a field insulating layer surrounding a sidewall of the active pattern on the upper surface of the substrate, a gate electrode extending in a second horizontal direction different from the first horizontal direction on the active pattern, a first through-via disposed inside the substrate on one side of the active pattern, the first through-via spaced apart from the active pattern in the second horizontal direction, an upper surface of the first through-via formed on the same plane as the upper surface of the substrate, a lower surface of the first through-via formed on the same plane as a lower surface of the substrate, an insulating liner disposed between the substrate and the first through-via, an upper interlayer insulating layer disposed on the field insulating layer, a second through-via connected to the first through-via by passing through the field insulating layer and the upper interlayer insulating layer in a vertical direction, a lower interlayer insulating layer disposed on the lower surface of the substrate, and a lower wiring pattern disposed inside the lower interlayer insulating layer, the lower wiring pattern connected to the first through-via, wherein a width of the first through-via in the second horizontal direction is continuously reduced as the first through-via becomes adjacent to the lower surface of the substrate.

According to some implementations of the present disclosure, there is provided a semiconductor device, comprising a substrate, a first active pattern extending in a first horizontal direction on an upper surface of the substrate, a second active pattern extending in the first horizontal direction on the upper surface of the substrate, the second active pattern spaced apart from the first active pattern in a second horizontal direction different from the first horizontal direction, a field insulating layer surrounding a sidewall of each of the first and second active patterns on the upper surface of the substrate, a first plurality of nanosheets stacked to be spaced apart from each other in a vertical direction on the first active pattern, a second plurality of nanosheets stacked to be spaced apart from each other in the vertical direction on the second active pattern, a gate electrode extending in the second horizontal direction on the first and second active patterns, the gate electrode surrounding each of the first and second plurality of nanosheets, a first source/drain region disposed on at least one side of the gate electrode on the first active pattern, a second source/drain region disposed on at least one side of the gate electrode on the second active pattern, a first through-via disposed inside the substrate between the first active pattern and the second active pattern, the first through-via spaced apart from each of the first and second active patterns in the second horizontal direction, an upper surface of the first through-via formed on the same plane as the upper surface of the substrate, a lower surface of the first through-via formed on the same plane as a lower surface of the substrate, an insulating liner disposed between the substrate and the first through-via, an upper surface of the insulating liner formed on the same plane as the upper surface of the first through-via, a lower surface of the insulating liner formed on the same plane as the lower surface of the first through-via, an upper interlayer insulating layer covering each of the first and second source/drain regions on the field insulating layer, a second through-via connected to the first through-via by passing through the field insulating layer and the upper interlayer insulating layer in the vertical direction, the second through-via spaced apart from each of the first and second source/drain regions in the second horizontal direction, a source/drain contact disposed on one side of the gate electrode inside the upper interlayer insulating layer, the source/drain contact connecting the first source/drain region with the second through-via, a lower interlayer insulating layer disposed on the lower surface of the substrate, and a lower wiring pattern disposed inside the lower interlayer insulating layer, the lower wiring pattern connected to the first through-via, wherein a width of the first through-via in the second horizontal direction is continuously reduced as the first through-via becomes adjacent to the lower surface of the substrate, and a width of the lower wiring pattern in the second horizontal direction is continuously reduced as the lower wiring pattern becomes adjacent to the lower surface of the first through-via.

BRIEF DESCRIPTION OF THE DRAWINGS

FIGS. 5 to 42 are views illustrating intermediate steps to describe a method for manufacturing a semiconductor device according to some implementations of the present disclosure;

FIGS. 46 to 49 are views illustrating intermediate steps to describe a method for manufacturing a semiconductor device according to some implementations of the present disclosure; and FIGS. 50 to 52 are views illustrating intermediate steps to describe a method for manufacturing a semiconductor device according to some implementations of the present disclosure.

DETAILED DESCRIPTION OF THE DISCLOSURE

A semiconductor device according to some implementations includes a MBCFET, which includes nanosheets, and a fin-type transistor (FinFET), which includes a channel region of a fin-type pattern shape, by way of example, but the present disclosure is not limited to such a shape. In some other implementations, the semiconductor device may include a tunneling transistor (tunneling FET) or a three-dimensional (3D) transistor. Also, the semiconductor device according to some other implementations may include a bipolar junction transistor or a laterally diffused metal oxide semiconductor (LDMOS) transistor.

Hereinafter, the semiconductor device according to some implementations of the present disclosure will be described with reference to FIGS. 1 to 4.

Figure 1:
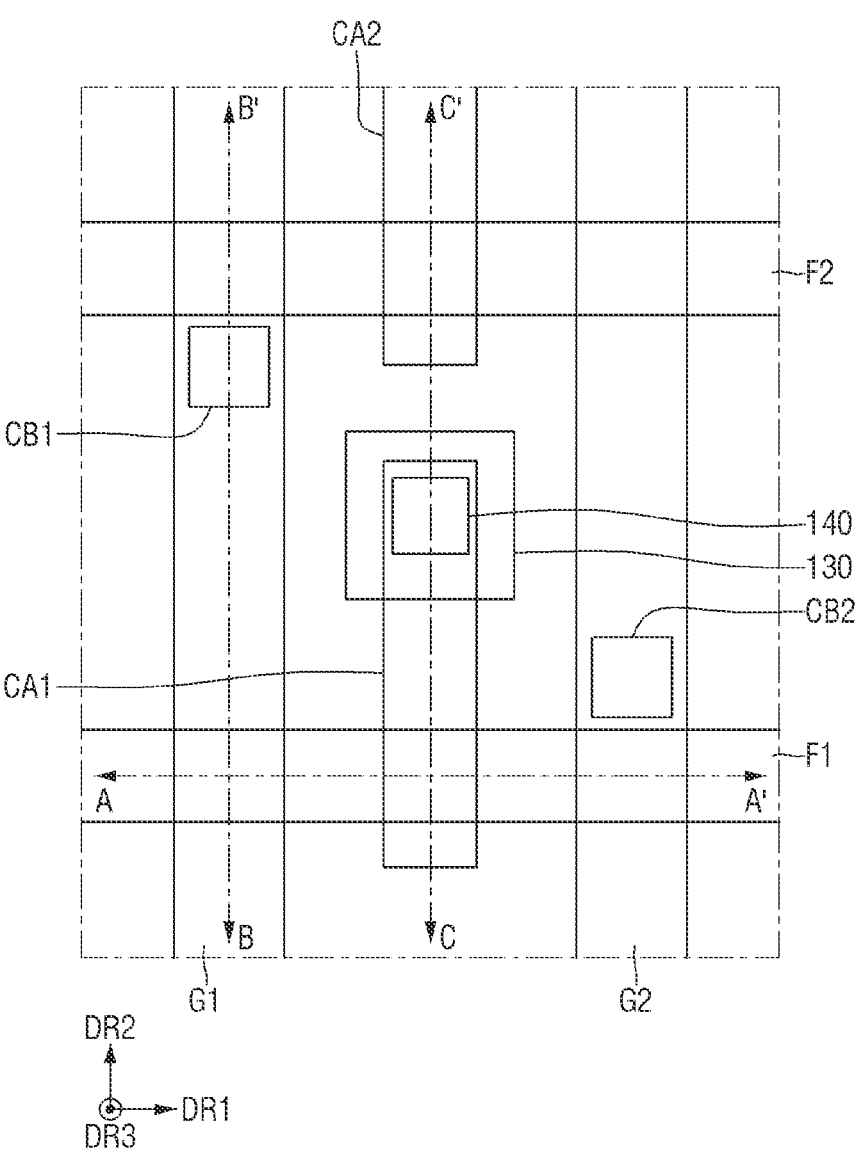
FIG. 1 is a layout view illustrating a semiconductor device according to some implementations of the present disclosure.
Figure 2:
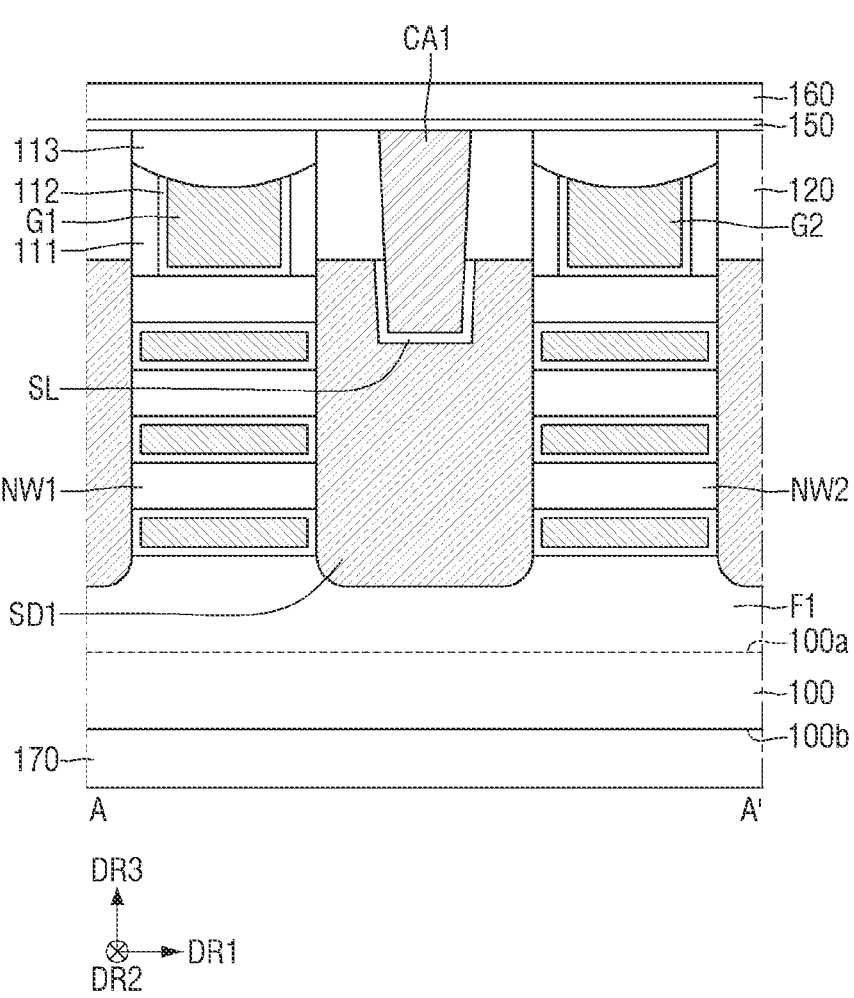
FIG. 2 is a cross-sectional view taken along line A-A' of FIG. 1.
Figure 3:
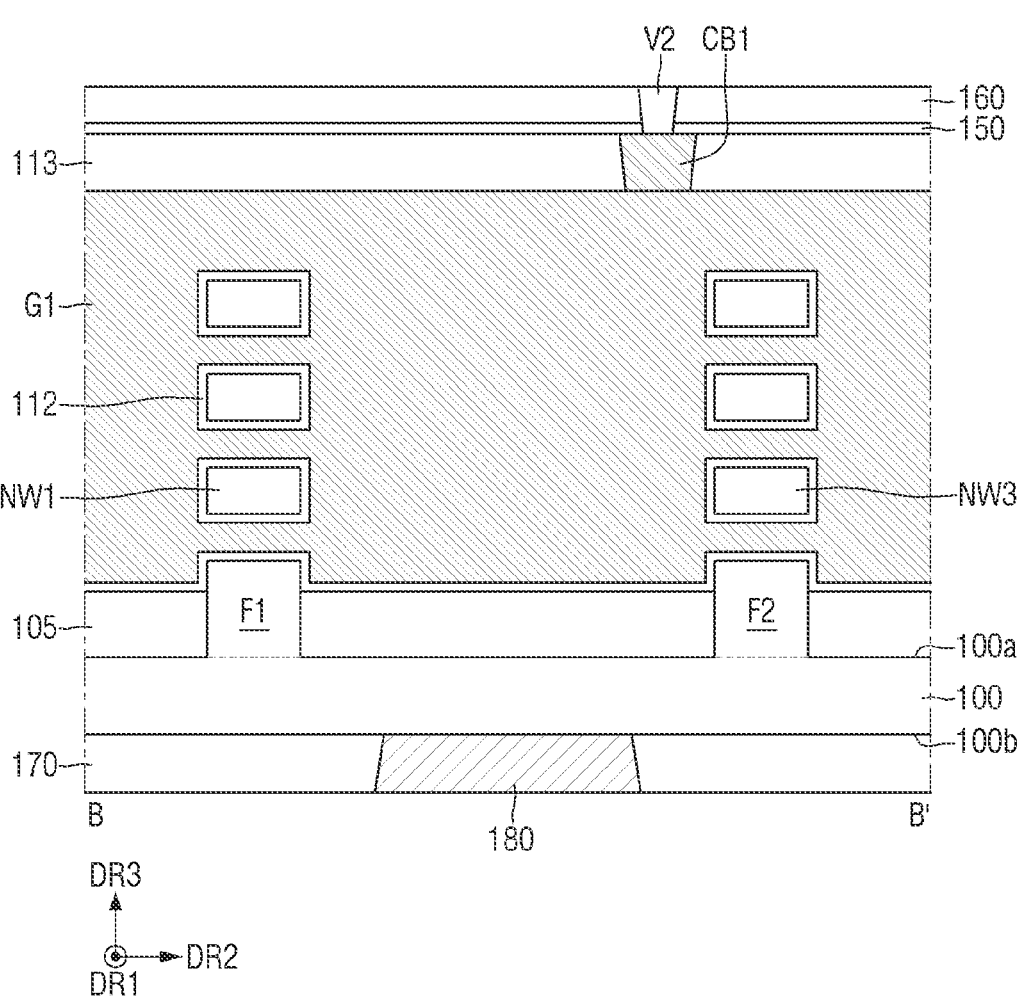
FIG. 3 is a cross-sectional view taken along line B-B' of FIG. 1.
Figure 4:
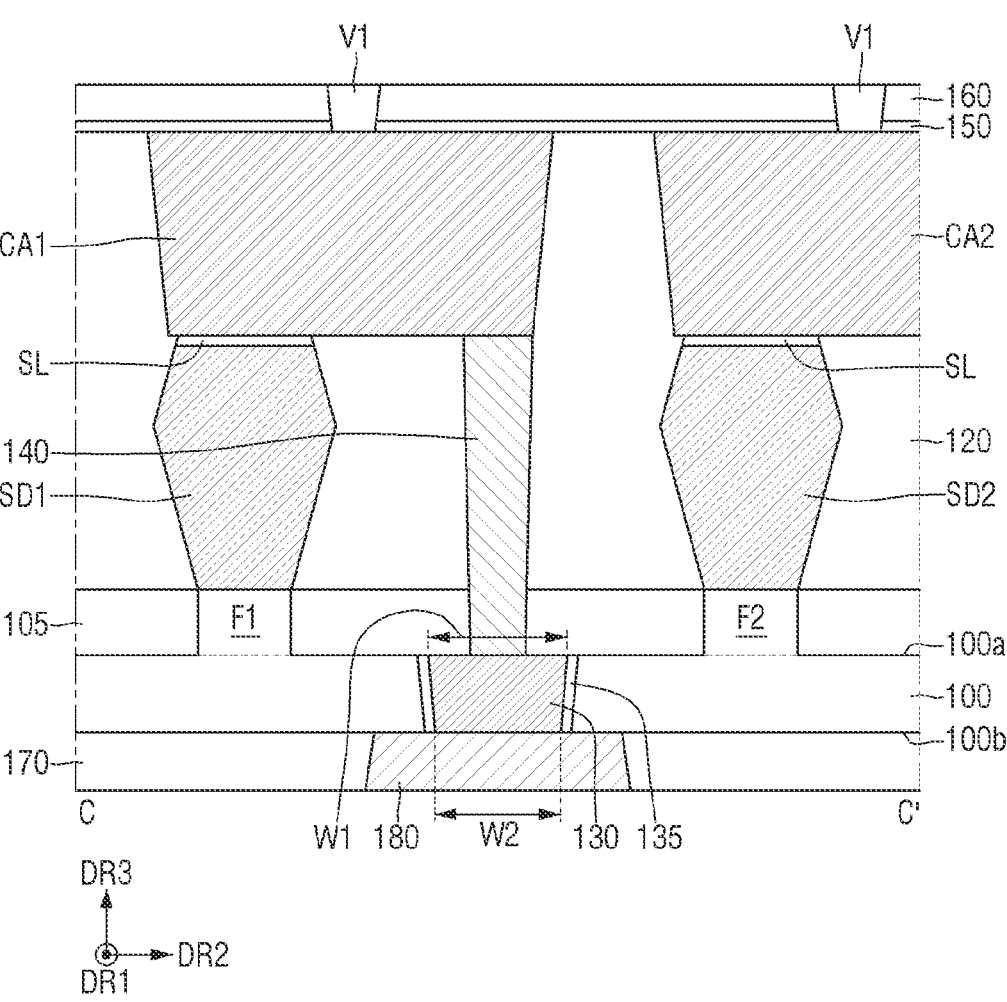
FIG. 4 is a cross-sectional view taken along line C-C' of FIG. 1.

FIG. 1 is a layout view illustrating a semiconductor device according to some implementations of the present disclosure. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1.

Referring to FIGS. 1 to 4, a semiconductor device according to some implementations of the present disclosure includes a substrate 100, a field insulating layer 105, first and second active patterns F1 and F2, first to third plurality of nanosheets NW1, NW2 and NW3, first and second gate electrodes G1 and G2, a gate spacer 111, a gate insulation layer 112, a capping pattern 113, first and second source/drain regions SD1 and SD2, a first upper interlayer insulating layer 120, a first through-via 130, an insulating liner 135, a second through-via 140, first and second source/drain contacts CA1 and CA2, a silicide layer SL, first and second gate contacts CB1 and CB2, an etch stop layer 150, a second upper interlayer insulating layer 160, first and second vias V1 and V2, a lower interlayer insulating layer 170, and a lower wiring pattern 180. In the implementations illustrated in FIGS. 1 to 4 and other implementations described in this disclosure, the phrase source/drain region may be understood to mean a region in which a source, a drain, or both a source and a drain of a transistor may be formed.

The substrate 100 may be a silicon substrate or a silicon-on-insulator (SOI). Alternatively, the substrate 100 may include silicon germanium, silicon germanium on insulator (SGOI), indium antimonide, lead telluride, indium arsenide, indium phosphide, gallium arsenide, or gallium antimonide, but the present disclosure is not limited thereto.

Hereinafter, each of a first horizontal direction DR1 and a second horizontal direction DR2 may be defined as a direction parallel with an upper surface 100a of the substrate 100. The second horizontal direction DR2 may be defined as a direction different from the first horizontal direction DR1. A vertical direction DR3 may be defined as a direction perpendicular to each of the first horizontal direction DR1 and the second horizontal direction DR2. That is, the vertical direction DR3 may be defined as a direction perpendicular to the upper surface 100a of the substrate 100.

Each of the first and second active patterns F1 and F2 may extend in the first horizontal direction DR1 on the upper surface 100a of the substrate 100. The second active pattern F2 may be spaced apart from the first active pattern F1 in the second horizontal direction DR2. Each of the first and second active patterns F1 and F2 may protrude from the upper surface 100a of the substrate 100 in the vertical direction DR3. For example, each of the first and second active patterns F1 and F2 may be a portion of the substrate 100, or may include an epitaxial layer grown from the substrate 100.

The field insulating layer 105 may be disposed on the upper surface 100a of the substrate 100. The field insulating layer 105 may surround sidewalls of each of the first and second active patterns F1 and F2. For example, an upper surface of each of the first and second active patterns F1 and F2 may protrude more in the vertical direction DR3 than an upper surface of the field insulating layer 105, but the present disclosure is not limited thereto. In some other implementations, the upper surface of each of the first and second active patterns F1 and F2 may be formed on the same plane as the upper surface of the field insulating layer 105. The field insulating layer 105 may include, for example, a silicon oxide layer, a silicon nitride layer, an oxynitride layer, or their combination layer.

The first plurality of nanosheets NW1 may be disposed on the first active pattern F1. The first plurality of nanosheets NW1 may be disposed at a portion where the first active pattern F1 and the first gate electrode G1 cross each other. The second plurality of nanosheets NW2 may be disposed on the first active pattern F1. The second plurality of nanosheets NW2 may be disposed at a portion where the first active pattern F1 and the second gate electrode G2 cross each other. The second plurality of nanosheets NW2 may be spaced apart from the first plurality of nanosheets NW1 in the first horizontal direction DR1. The third plurality of nanosheets NW3 may be disposed on the second active pattern F2. The third plurality of nanosheets NW3 may be disposed at a portion where the second active pattern F2 and the first gate electrode G1 cross each other. The third plurality of nanosheets NW3 may be spaced apart from the first plurality of nanosheets NW1 in the second horizontal direction DR2.

Each of the first to third plurality of nanosheets NW1, NW2 and NW3 may include a plurality of nanosheets that are stacked to be spaced apart from each other in the vertical direction DR3. Although FIGS. 2 and 3 illustrate that each of the first to third plurality of nanosheets NW1, NW2 and NW3 includes three nanosheets which are stacked to be spaced apart from one another in the vertical direction DR3, this is for convenience of description, and the present disclosure is not limited thereto. In some other implementations, each of the first to third plurality of nanosheets NW1, NW2 and NW3 may include four or more nanosheets stacked to be spaced apart from one another in the vertical direction DR3.

For example, each of the first to third plurality of nanosheets NW1, NW2 and NW3 may include silicon (Si), but the present disclosure is not limited thereto. In some other implementations, each of the first to third plurality of nanosheets NW1, NW2 and NW3 may include silicon germanium (SiGe).

The first gate electrode G1 may extend in the second horizontal direction DR2 on the first active pattern F1, the second active pattern F2 and the field insulating layer 105. The first gate electrode G1 may surround each of the first plurality of nanosheets NW1 and the third plurality of nanosheets NW3. The second gate electrode G2 may extend in the second horizontal direction DR2 on the first active pattern F1, the second active pattern F2, and the field insulating layer 105. The second gate electrode G2 may be spaced apart from the first gate electrode G1 in the first horizontal direction DR1. The second gate electrode G2 may surround the second plurality of nanosheets NW2.

Each of the first and second gate electrodes G1 and G2 includes at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or their combination. Each of the first and second gate electrodes G1 and G2 may include an oxidized form of the above-described materials.

The gate spacer 111 may extend in the second horizontal direction DR2 along both sidewalls of the first gate electrode G1 on an upper surface of the uppermost nanosheet of the first plurality of nanosheets NW1, an upper surface of the uppermost nanosheet of the third plurality of nanosheets NW3 and the field insulating layer 105. Also, the gate spacer 111 may extend in the second horizontal direction DR2 along both sidewalls of the second gate electrode G2 on an upper surface of the uppermost nanosheet of the second plurality of nanosheets NW2 and the field insulating layer 105.

The gate spacer 111 may include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC) or their combination, but the present disclosure is not limited thereto.

The gate insulating layer 112 may be disposed between each of the first and second gate electrodes G1 and G2 and the gate spacer 111. The gate insulating layer 112 may be disposed on the sidewalls of each of the first and second gate electrodes G1 and G2 in the first horizontal direction DR1. The gate insulating layer 112 may be disposed between each of the first and gate electrodes G1 and G2 and each of the first and second active patterns F1 and F2. The gate insulating layer 112 may be disposed between each of the first and second gate electrodes G1 and G2 and the fielding insulating layer 105. The gate insulating layer 112 may be disposed between the first gate electrode G1 and the first and third plurality of nanosheets NW1 and NW3. The gate insulating layer 112 may be disposed between the second gate electrode G2 and the second plurality of nanosheets NW2.

The gate insulating layer 112 may include at least one of silicon oxide, silicon oxynitride, silicon nitride, or a high dielectric constant material having a dielectric constant greater than that of the silicon oxide. The high dielectric constant material may include one or more of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some other implementations may include a negative capacitance (NC) FET based on a negative capacitor. For example, the gate insulating layer 112 may include a ferroelectric material layer having ferroelectric characteristics and a paraelectric material layer having paraelectric characteristics.

The ferroelectric material layer may have a negative capacitance, and the paraelectric material layer may have a positive capacitance. For example, when two or more capacitors are connected in series and the capacitance of each capacitor has a positive value, the total capacitance is more reduced than the capacitance of each individual capacitor. On the other hand, when at least one of capacitances of two or more capacitors connected in series has a negative value, the total capacitance may have a positive value and may be greater than an absolute value of each individual capacitance.

When the ferroelectric material layer having a negative capacitance and the paraelectric material layer having a positive capacitance are connected in series, the total capacitance value of the ferroelectric material layer and the para-electric material layer, which are connected in series, may be increased. Based on the total capacitance value that is increased, a transistor having the ferroelectric material layer may have a subthreshold swing (SS) less than 60 mV/decade at a room temperature.

The ferroelectric material layer may have ferroelectric characteristics. The ferroelectric material layer may include at least one of, for example, hafnium oxide, hafnium zirconium oxide, barium strontium titanium oxide, barium titanium oxide, or lead zirconium titanium oxide. In this case, for example, the hafnium zirconium oxide may be a material doped with zirconium (Zr) in hafnium oxide. For another example, the hafnium zirconium oxide may be a compound of hafnium (Hf), zirconium (Zr) and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). A type of the dopant included in the ferroelectric material layer may be varied depending on the ferroelectric material of the ferroelectric material layer.

When the ferroelectric material layer includes hafnium oxide, the dopant included in the ferroelectric material layer may include at least one of gadolinium (Gd), silicon (Si), zirconium (Zr), aluminum (Al), or yttrium (Y).

When the dopant is aluminum (Al), the ferroelectric material layer may include aluminum of 3 atomic % (at %) to 8 at %. In this case, a ratio of the dopant may be a ratio of aluminum to a sum of hafnium and aluminum.

When the dopant is silicon (Si), the ferroelectric material layer may include silicon of 2 at % to 10 at %. When the dopant is yttrium (Y), the ferroelectric material layer may include yttrium of 2 at % to 10 at %. When the dopant is gadolinium (Gd), the ferroelectric material layer may include gadolinium of 1 at % to 7 at %. When the dopant is zirconium (Zr), the ferroelectric material layer may include zirconium of 50 at % to 80 at %.

The paraelectric material layer may have paraelectric characteristics. The paraelectric material layer may include at least one of, for example, silicon oxide or metal oxide having a high dielectric constant. The metal oxide included in the paraelectric material layer may include at least one of, for example, hafnium oxide, zirconium oxide, or aluminum oxide, but is not limited thereto.

The ferroelectric material layer and the paraelectric material layer may include the same material. Although the ferroelectric material layer has ferroelectric characteristics, the paraelectric material layer may not have ferroelectric characteristics. For example, when the ferroelectric material layer and the paraelectric material layer include hafnium oxide, a crystal structure of hafnium oxide included in the ferroelectric material layer is different from that of hafnium oxide included in the paraelectric material layer.

The ferroelectric material layer may have a thickness having ferroelectric characteristics. The thickness of the ferroelectric material layer may be, for example, 0.5 nm to 10 nm, but is not limited thereto. Since a threshold thickness indicating ferroelectric characteristics may be varied depending on each ferroelectric material, the thickness of the ferroelectric material layer may be varied depending on the ferroelectric material.

For example, the gate insulating layer 112 may include one ferroelectric material layer. For another example, the gate insulating layer 112 may include a plurality of ferroelectric material layers spaced apart from each other. The gate insulating layer 112 may have a stacked layer structure in which a plurality of ferroelectric material layers and a plurality of paraelectric material layers are alternately stacked.

The capping pattern 113 may extend in the second horizontal direction DR2 on each of the first and second gate electrodes G1 and G2, the gate insulating layer 112 and the gate spacer 111. For example, the capping pattern 113 may be in contact with an upper surface of the gate spacer 111, but the present disclosure is not limited thereto. In some other implementations, the capping pattern 113 may be disposed between the gate spacers 111. The capping pattern 113 may include at least one of, for example, silicon nitride (SiN), silicon oxynitride (SiON), silicon oxide ($SiO_2$), silicon carbonitride (SiCN), silicon oxycarbonitride (SiOCN), or their combination, but the present disclosure is not limited thereto.

The first source/drain region SD1 may be disposed on at least one side of each of the first gate electrode G1 and the second gate electrode G2 on the first active pattern F1. For example, the first source/drain region SD1 may be disposed on both sides of each of the first gate electrode G1 and the second gate electrode G2 on the first active pattern F1. The second source/drain region SD2 may be disposed on at least one side of each of the first gate electrode G1 and the second gate electrode G2 on the second active pattern F2. For example, the second source/drain region SD2 may be disposed on both sides of each of the first gate electrode G1 and the second gate electrode G2 on the second active pattern F2.

For example, the first source/drain region SD1 may be in contact with both sidewalls of each of the first plurality of nanosheets NW1 and the second plurality of nanosheets NW2 in the first horizontal direction DR1. The second source/drain region SD2 may be in contact with both sidewalls of the third plurality of nanosheets NW3 in the first horizontal direction DR1. For example, each of the first source/drain region SD1 and the second source/drain region SD2 may be in contact with the gate insulating layer 112, but the present disclosure is not limited thereto. In some other implementations, an inner spacer may be disposed between each of the first source/drain region SD1 and the second source/drain region SD2 and the gate insulating layer 112. In this case, the inner spacer may include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or their combination.

The first upper interlayer insulating layer 120 may be disposed on the field insulating layer 105. Although the first upper interlayer insulating layer 120 is shown in FIG. 4 as being in contact with the upper surface of the field insulating layer 105, the present disclosure is not limited thereto. In some other implementations, the etch stop layer 150 may be disposed between the upper surface of the field insulating layer 105 and the first upper interlayer insulating layer 120. The first upper interlayer insulating layer 120 may cover each of the first and second source/drain regions SD1 and SD2. The first upper interlayer insulating layer 120 may surround sidewalls of each of the gate spacer 111 and the capping pattern 113. For example, an upper surface of the first upper interlayer insulating layer 120 may be formed on the same plane as an upper surface of the capping pattern 113, but the present disclosure is not limited thereto. In some other implementations, the first upper interlayer insulating layer 120 may cover the upper surface of the capping pattern 113.

The first upper interlayer insulating layer 120 may include at least one of, for example, silicon oxide, silicon nitride, silicon oxynitride or a low dielectric constant material. The low dielectric constant material may include Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoxySiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SILK, Amorphous Fluorinated Carbon, silica aerogels, silica xerogels, mesoporous silica or their combination, but the present disclosure is not limited thereto.

The first through-via 130 may be disposed inside the substrate 100. The first through-via 130 may be disposed between the first active pattern F1 and the second active pattern F2. The first through-via 130 may be spaced apart from each of the first active pattern F1 and the second active pattern F2 in the second horizontal direction DR2. The first through-via 130 does not overlap each of the first active pattern F1 and the second active pattern F2 in the vertical direction DR3. The first through-via 130 may be disposed between the first gate electrode G1 and the second gate electrode G2. The first through-via 130 may be spaced apart from each of the first gate electrode G1 and the second gate electrode G2 in the first horizontal direction DR1. The first through-via 130 does not overlap each of the first gate electrode G1 and the second gate electrode G2 in the vertical direction DR3.

For example, an upper surface of the first through-via 130 may be formed on the same plane as the upper surface 100a of the substrate 100. A lower surface of the first through-via 130 may be formed on the same plane as the lower surface 100b of the substrate 100. For example, at least a portion of the upper surface of the first through-via 130 may be in contact with the field insulating layer 105. For example, a sidewall of the first through-via 130 may be spaced apart from the substrate 100. That is, the first through-via 130 does not contact the substrate 100. Although the first through-via 130 is shown in FIG. 4 as being formed of a single layer, the present disclosure is not limited thereto. In some other implementations, the first through-via 130 may be formed of multiple layers.

For example, a width W1 of the upper surface of the first through-via 130 in the second horizontal direction DR2 may be greater than a width W2 of the lower surface of the first through-via 130 in the second horizontal direction DR2. The width of the first through-via 130 in the second horizontal direction DR2 may be continuously reduced as the first through-via 130 becomes adjacent to the lower surface 100b of the substrate 100. For example, the sidewall of the first through-via 130 may have a constant slope profile.

The first through-via 130 may include a conductive material. The first through-via 130 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Rh), rhodium (Rh), aluminum (Al), copper (Cu), or molybdenum (M).

The insulating liner 135 may be disposed inside the substrate 100. The insulating liner 135 may be disposed between the substrate 100 and the sidewall of the first through-via 130. For example, the insulating liner 135 may be formed to be conformal. For example, the insulating liner 135 may extend from the lower surface of the first through-via 130 to the upper surface of the first through-via 130. That is, an upper surface of the insulating liner 135 may be formed on the same plane as the upper surface of the first through-via 130. Further, a lower surface of the insulating liner 135 may be formed on the same plane as the lower surface of the first through-via 130.

For example, the insulating liner 135 may be in contact with each of the sidewall of the first through-via 130 and the substrate 100. The first through-via 130 may be electrically insulated from the substrate 100 by the insulating liner 135. For example, the upper surface of the insulating liner 135 may be in contact with the field insulating layer 105. The insulating liner 135 may include an insulating material. The insulating liner 135 may include at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC) or their combination, but the present disclosure is not limited thereto.

The second through-via 140 may pass through the field insulating layer 105 and the first upper interlayer insulating layer 120 in the vertical direction DR3. Although the uppermost surface of the second through-via 140 is shown in FIG. 4 as being formed to be lower than the upper surface of the first upper interlayer insulating layer 120, the present disclosure is not limited thereto. In some other implementations, the uppermost surface of the second through-via 140 may be formed on the same plane as the upper surface of the first upper interlayer insulating layer 120.

The second through-via 140 may be disposed between the first active pattern F1 and the second active pattern F2. The second through-via 140 may be spaced apart from each of the first active pattern F1 and the second active pattern F2 in the second horizontal direction DR2. The second through-via 140 may be disposed between the first source/drain region SD1 and the second source/drain region SD2. The second through-via 140 may be spaced apart from each of the first source/drain region SD1 and the second source/drain region SD2 in the second horizontal direction DR2. The second through-via 140 may be disposed between the first gate electrode G1 and the second gate electrode G2. The second through-via 140 may be spaced apart from each of the first gate electrode G1 and the second gate electrode G2 in the first horizontal direction DR1.

The second through-via 140 may be connected to the first through-via 130. That is, a lower surface of the second through-via 140 may be in contact with the upper surface of the first through-via 130. Although the second through-via 140 is shown in FIG. 4 as being formed of a single layer, the present disclosure is not limited thereto. In some other implementations, the second through-via 140 may be formed of multiple layers. For example, a width of the second through-via 140 in the second horizontal direction DR2 may be continuously reduced as the second through-via becomes adjacent to the upper surface of the first through-via 130. For example, a sidewall of the second through-via 140 may have a constant slope profile.

The second through-via 140 may include a conductive material. The second through-via 140 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Rh), rhodium (Rh), aluminum (Al), copper (Cu), or molybdenum (M).

The T first source/drain contact CA1 may be disposed inside the first upper interlayer insulating layer 120. The first source/drain contact CA1 may extend in the second horizontal direction DR2 between the first gate electrode G1 and the second gate electrode G2. The first source/drain contact CA1 may be connected to each of the first source/drain region SD1 and the second through-via 140. That is, the first source/drain region SD1 and the second through-via 140 may be electrically connected to each other through the first source/drain contact CA1.

The first source/drain contact CA1 may overlap the second through-via 140 in the vertical direction DR3. Although the second through-via 140 is shown in FIG. 4 as fully overlapping the first source/drain contact CA1 in the vertical direction DR3, the present disclosure is not limited thereto. In some other implementations, a portion of the second through-via 140 may overlap the first source/drain contact CA1 in the vertical direction DR3, and the other portion of the second through-via 140 may extend to the upper surface of the first upper interlayer insulating layer 120 in the vertical direction DR3. For example, an upper surface of the first source/drain contact CA1 may be formed on the same plane as the upper surface of the first upper interlayer insulating layer 120, but the present disclosure is not limited thereto.

The second source/drain contact CA2 may be disposed inside the first upper interlayer insulating layer 120. The second source/drain contact CA2 may extend in the second horizontal direction DR2 between the first gate electrode G1 and the second gate electrode G2. The second source/drain contact CA2 may be spaced apart from the first source/drain contact CA1 in the second horizontal direction DR2. The second source/drain contact CA2 may be connected to the second source/drain region SD2. For example, an upper surface of the second source/drain contact CA2 may be formed on the same plane as the upper surface of the first upper interlayer insulating layer 120, but the present disclosure is not limited thereto.

In FIGS. 2 and 4, each of the first source/drain contact CA1 and the second source/drain contact CA2 is shown as being formed of a single layer, but the present disclosure is not limited thereto. In some other implementations, each of the first source/drain contact CA1 and the second source/drain contact CA2 may be formed of multiple layers. Each of the first source/drain contact CA1 and the second source/drain contact CA2 may include a conductive material. Each of the first source/drain contact CA1 and the second source/drain contact CA2 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Rh), rhodium (Rh), aluminum (Al), copper (Cu), or molybdenum (M).

The silicide layer SL may be disposed between the first source/drain contact CA1 and the first source/drain region SD1. In addition, the silicide layer SL may be disposed between the second source/drain contact CA2 and the second source/drain region SD2. The silicide layer SL may include, for example, a metal silicide material.

The first gate contact CB1 may be connected to the first gate electrode G1 by passing through the capping pattern 113 in the vertical direction DR3. The second gate contact CB2 may be connected to the second gate electrode G2 by passing through the capping pattern 113 in the vertical direction DR3. For example, an upper surface of each of the first gate contact CB1 and the second gate contact CB2 may be formed on the same plane as the upper surface of the first upper interlayer dielectric 120.

Although the first gate contact CB1 is shown in FIG. 3 as being formed of a single layer, the present disclosure is not limited thereto. In some other implementations, each of the first gate contact CB1 and the second gate contact CB2 may be formed of multiple layers. Each of the first gate contact CB1 and the second gate contact CB2 may include a conductive material. Each of the first gate contact CB1 and the second gate contact CB2 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Rh), rhodium (Rh), aluminum (Al), copper (Cu), or molybdenum (M).

The etch stop layer 150 may be disposed on the upper surface of each of the first upper interlayer insulating layer 120, the capping pattern 113, the first and second gate contacts CB1 and CB2, and the first and second source/drain contacts CA1 and CA2. Although the etch stop layer 150 is shown in FIGS. 2 to 4 as being formed as a single layer, the present disclosure is not limited thereto. In some other implementations, the etch stop layer 150 may be formed of multiple layers. The etch stop layer 150 may include at least one of, for example, aluminum oxide, aluminum nitride, hafnium oxide, zirconium oxide, silicon oxide, silicon nitride, silicon oxynitride, or a low dielectric constant material. The second upper interlayer insulating layer 160 may be disposed on the etch stop layer 150. The second upper interlayer insulating layer 160 may include at least one of, for example, silicon oxide, silicon nitride, silicon oxynitride, or a low dielectric constant material.

The first via V1 may be connected to any one of the first source/drain contact CA1 and the second source/drain contact CA2 by passing through the second upper interlayer insulating layer 160 and the etch stop layer 150 in the vertical direction DR3. The second via V2 may be connected to any one of the first gate contact CB1 and the second gate contact CB2 by passing through the second upper interlayer insulating layer 160 and the etch stop layer 150 in the vertical direction DR3. Although each of the first via V1 and the second via V2 is shown in FIGS. 3 and 4 as being formed of a single layer, the present disclosure is not limited thereto. That is, each of the first via V1 and the second via V2 may be formed of multiple layers. Each of the first via V1 and the second via V2 may include a conductive material.

The lower interlayer insulating layer 170 may be disposed on the lower surface 100b of the substrate 100. The lower interlayer insulating layer 170 may include at least one of, for example, silicon oxide, silicon nitride, silicon oxynitride, or a low dielectric constant material. The lower wiring pattern 180 may be disposed inside the lower interlayer insulating layer 170. For example, the lower wiring pattern 180 may extend in the first horizontal direction DR1, but the present disclosure is not limited thereto. In some other implementations, the lower wiring pattern 180 may extend in the second horizontal direction DR2. For example, the lower wiring pattern 180 may be a power rail or a ground rail.

The lower wiring pattern 180 may be connected to the first through-via 130. For example, a width of an upper surface of the lower wiring pattern 180 in the second horizontal direction DR2 may be greater than the width W2 of the lower surface of the first through-via 130 in the second horizontal direction DR2. The lower wiring pattern 180 may be in contact with the lower surface of the first through-via 130. In addition, the lower wiring pattern 180 may be in contact with the lower surface of the insulating liner 135. For example, the width of the lower wiring pattern 180 in the second horizontal direction DR2 may be continuously reduced as the lower wiring pattern 180 becomes adjacent to the lower surface of the first through-via 130. For example, the sidewall of the lower wiring pattern 180 may have a constant slope profile. The lower wiring pattern 180 may include a conductive material. For example, the lower wiring pattern 180 may include an insulating layer disposed on a portion that is in contact with the lower surface 100b of the substrate 100.

Hereinafter, a method for manufacturing a semiconductor device according to some implementations of the present disclosure will be described with reference to FIGS. 5 to 42.

FIGS. 5 to 42 are views illustrating intermediate steps to describe a method for manufacturing a semiconductor device according to some implementations of the present disclosure.

Figure 5:
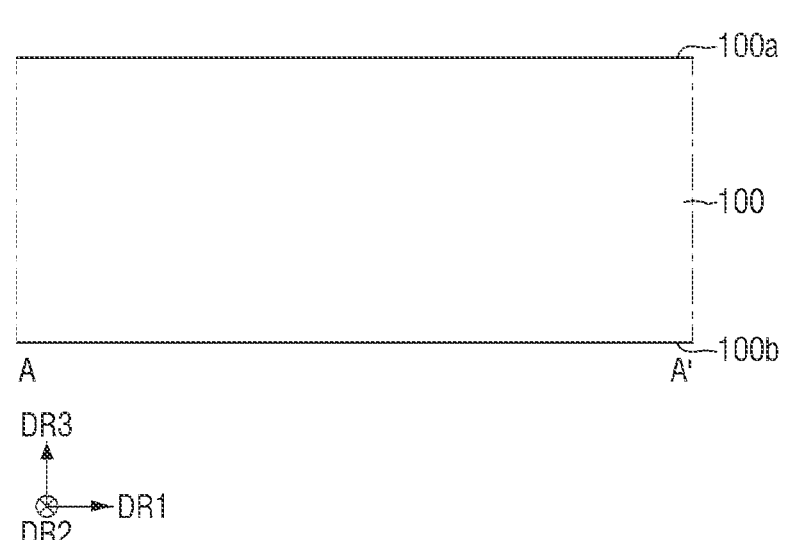
Figure 6:
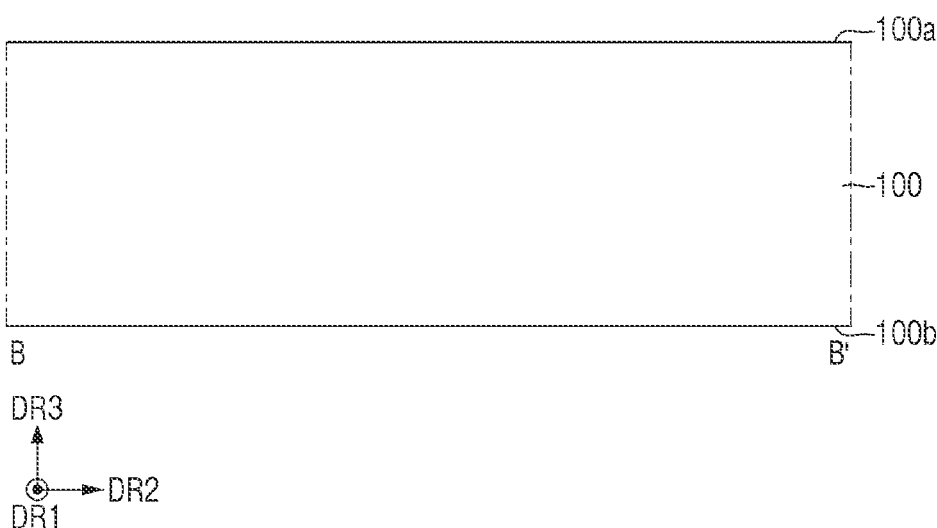
Figure 7:
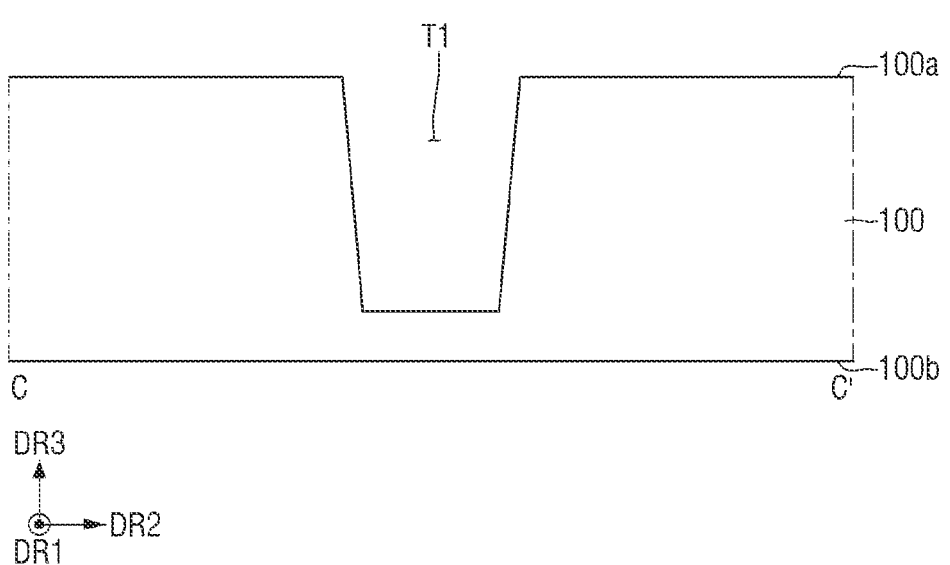

Referring to FIGS. 5 to 7, a first trench T1 may be formed inside the substrate 100. The first trench T1 may extend from the upper surface 100a of the substrate 100 to the inside of the substrate 100. Sidewalls and a bottom surface of the first trench T1 may be defined by the substrate 100.

Figure 8:
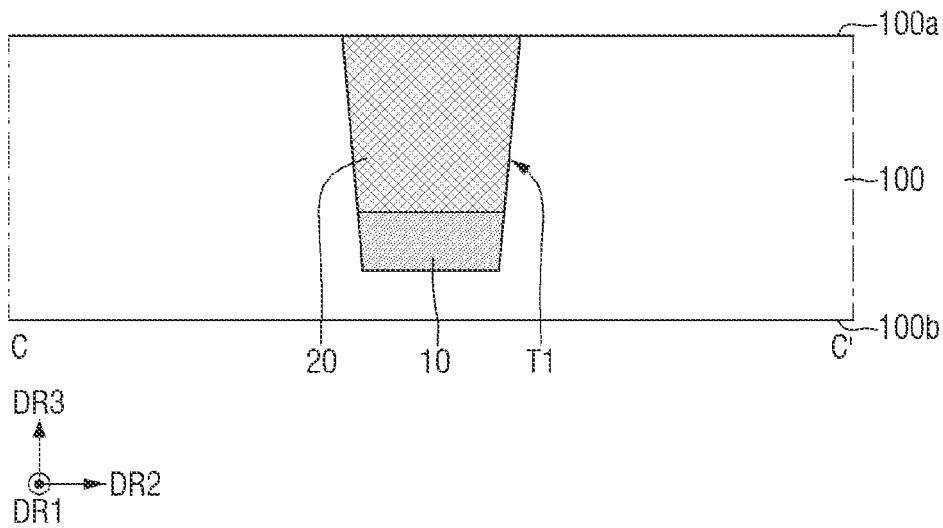

Referring to FIG. 8, a first sacrificial layer 10 may be formed inside the first trench T1. The first sacrificial layer 10 may fill a portion of the first trench T1. The first sacrificial layer 10 may include an insulating material. The first sacrificial layer 10 may include at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), or their combination, but the present disclosure is not limited thereto.

Subsequently, a second sacrificial layer 20 may be formed on the first sacrificial layer 10 inside the first trench T1. The second sacrificial layer 20 may fill the other portion of the first trench T1 on the first sacrificial layer 10. The second sacrificial layer 20 may include an insulating material. For example, an upper surface of the second sacrificial layer 20 may be formed on the same plane as the upper surface 100a of the substrate 100. The second sacrificial layer 20 may include a material different from that of the first sacrificial layer 10. The second sacrificial layer 20 may include at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), or their combination, but the present disclosure is not limited thereto.

Figure 9:
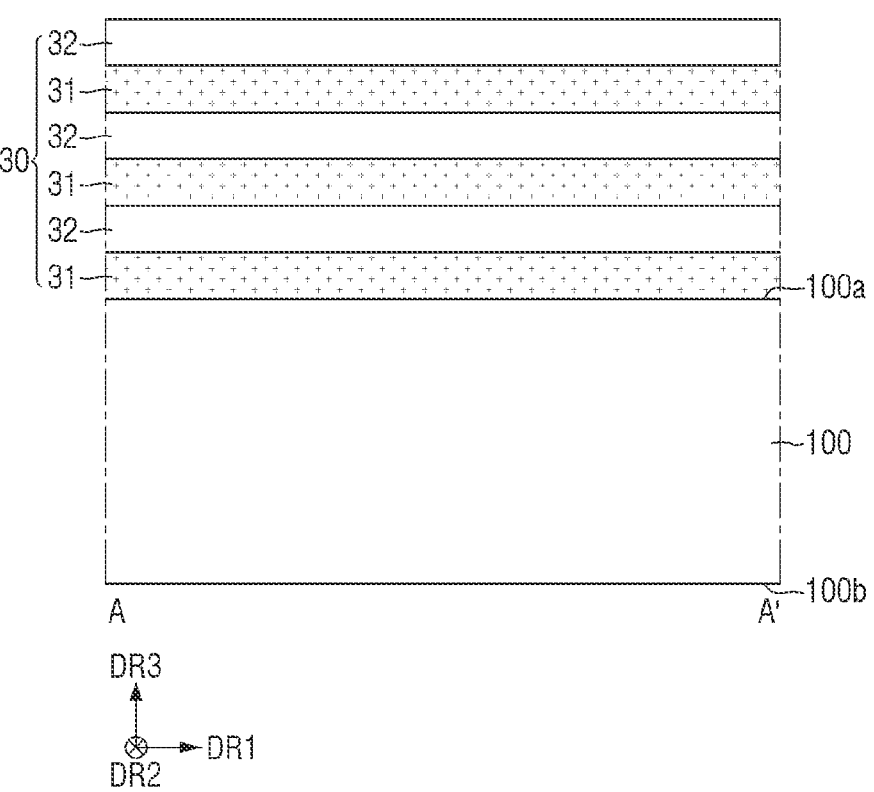
Figure 10:
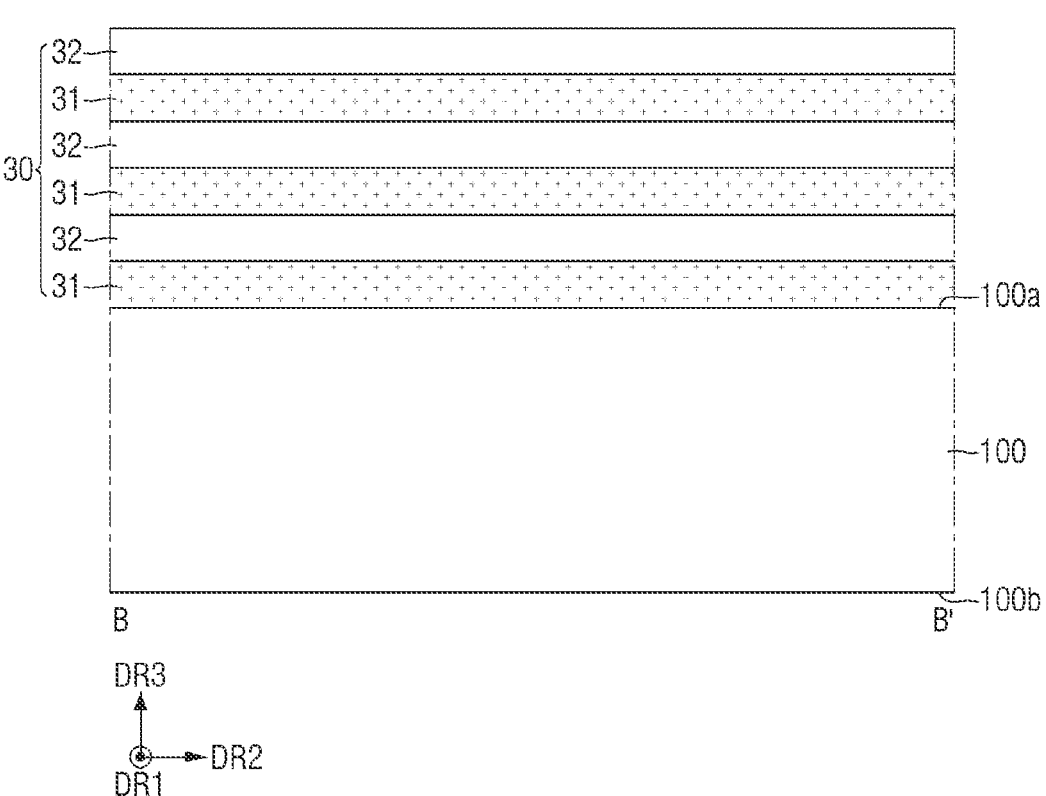
Figure 11:
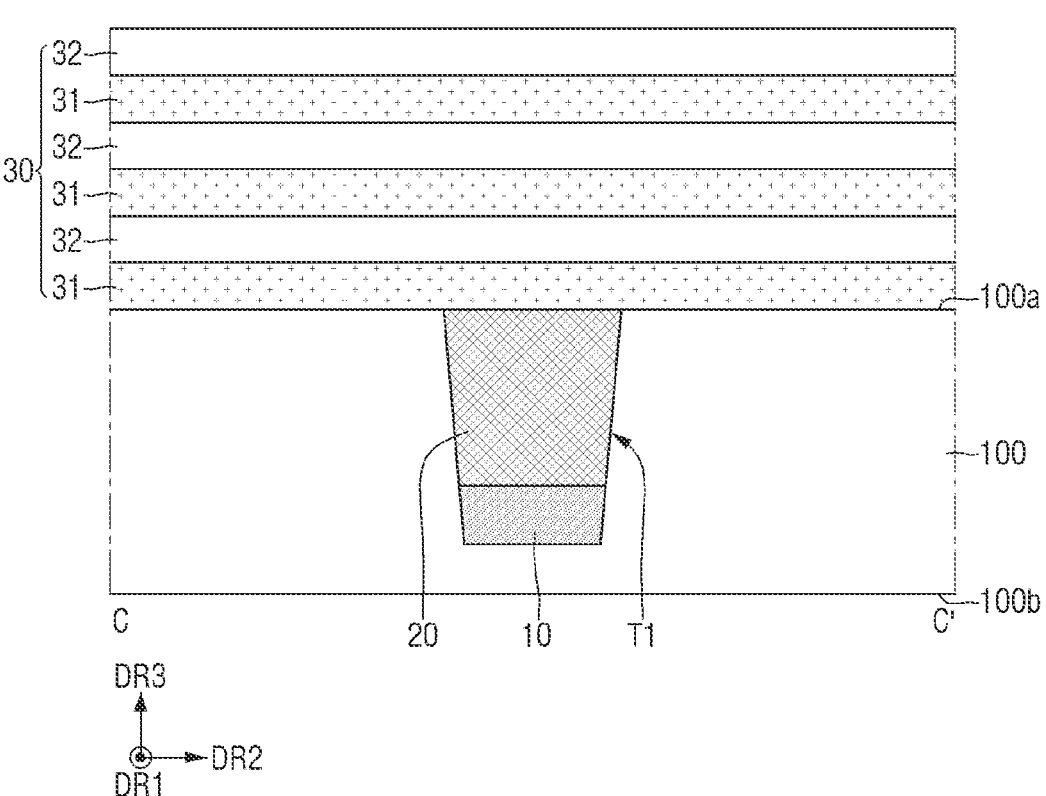

Referring to FIGS. 9 to 11, a stacked structure 30 may be formed on each of the upper surface 100a of the substrate 100 and the upper surface of the second sacrificial layer 20. The stacked structure 30 may include a first semiconductor layer 31 and a second semiconductor layer 32, which are alternately stacked on the upper surface 100a of the substrate 100 and the upper surface of the second sacrificial layer 20, respectively. For example, the first semiconductor layer 31 may be formed on the lowermost portion of the stacked structure 30, and the second semiconductor layer 32 may be formed on the uppermost portion of the stacked structure 30, but the present disclosure is not limited thereto. In some other implementations, the first semiconductor layer 31 may be also formed on the uppermost portion of the stacked structure 30. The first semiconductor layer 31 may include, for example, silicon germanium (SiGe). The second semiconductor layer 32 may include, for example, silicon (Si).

Figure 12:
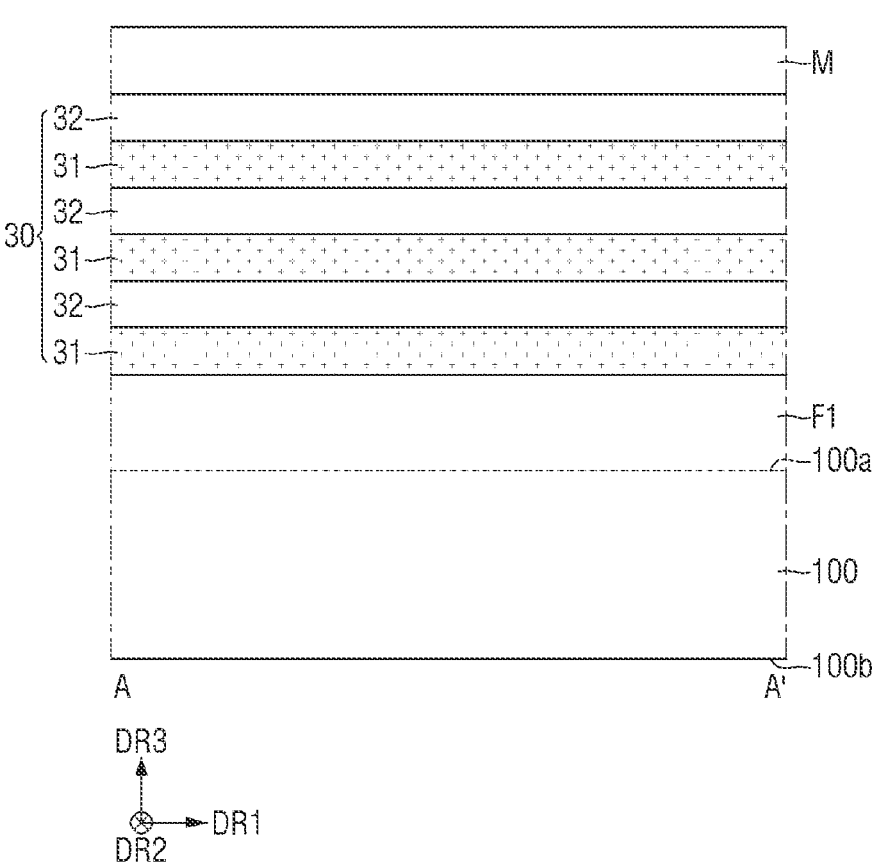
Figure 13:
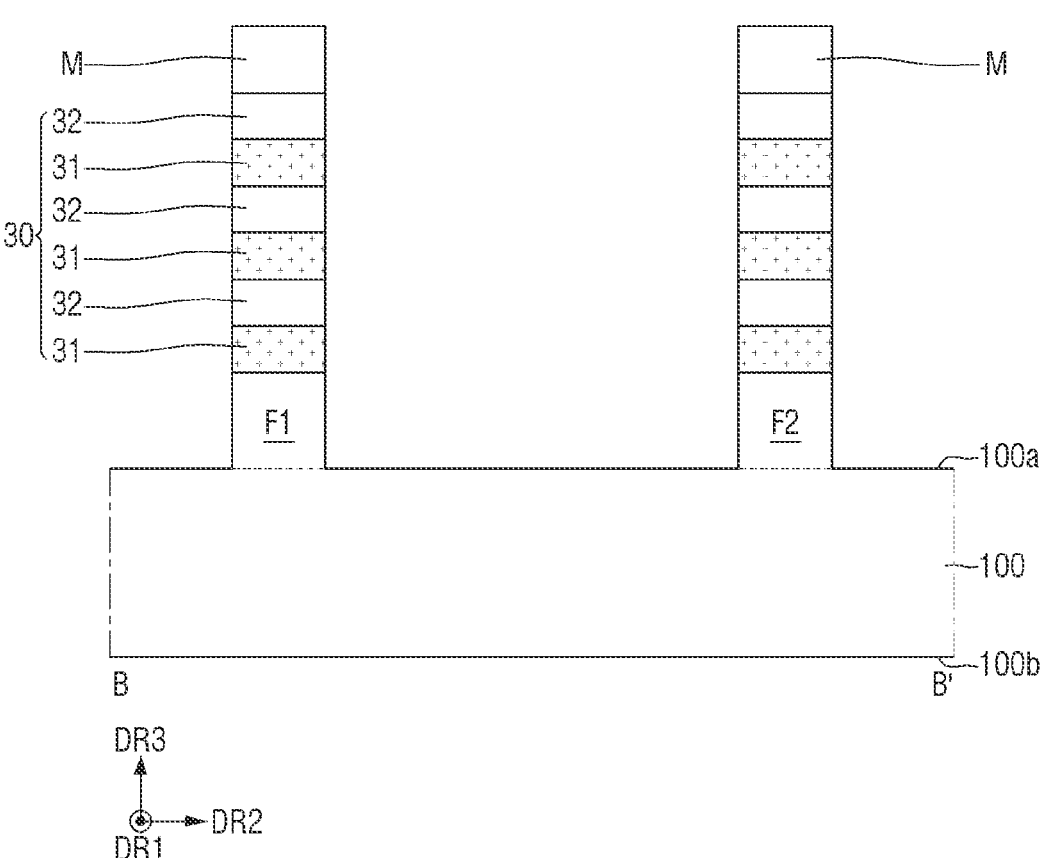
Figure 14:
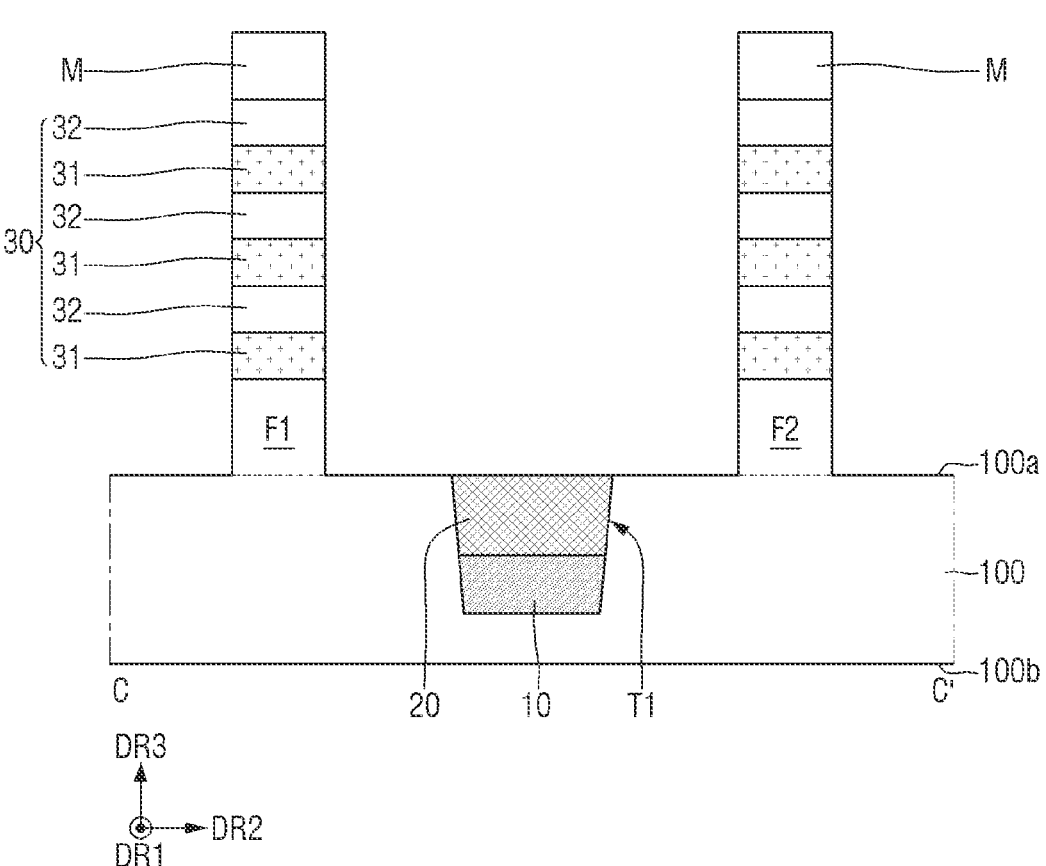

Referring to FIGS. 12 to 14, a mask pattern M may be formed on the stacked structure 30. A portion of the stacked structure 30 may be etched using the mask pattern M as a mask. While the stacked structure 30 is being etched, a portion of the substrate 100 and a portion of the second sacrificial layer 20 may be etched. Through the etching process, the first active pattern F1 and the second active pattern F2 may be respectively defined below the stacked structure 30 on the upper surface 100a of the substrate 100. Each of the first active pattern F1 and the second active pattern F2 may extend in the first horizontal direction DR1. The second active pattern F2 may be spaced apart from the first active pattern F1 in the second horizontal direction DR2. After the etching process for the stacked structure 30 is completed, the upper surface of the second sacrificial layer 20 may be exposed.

Figure 15:
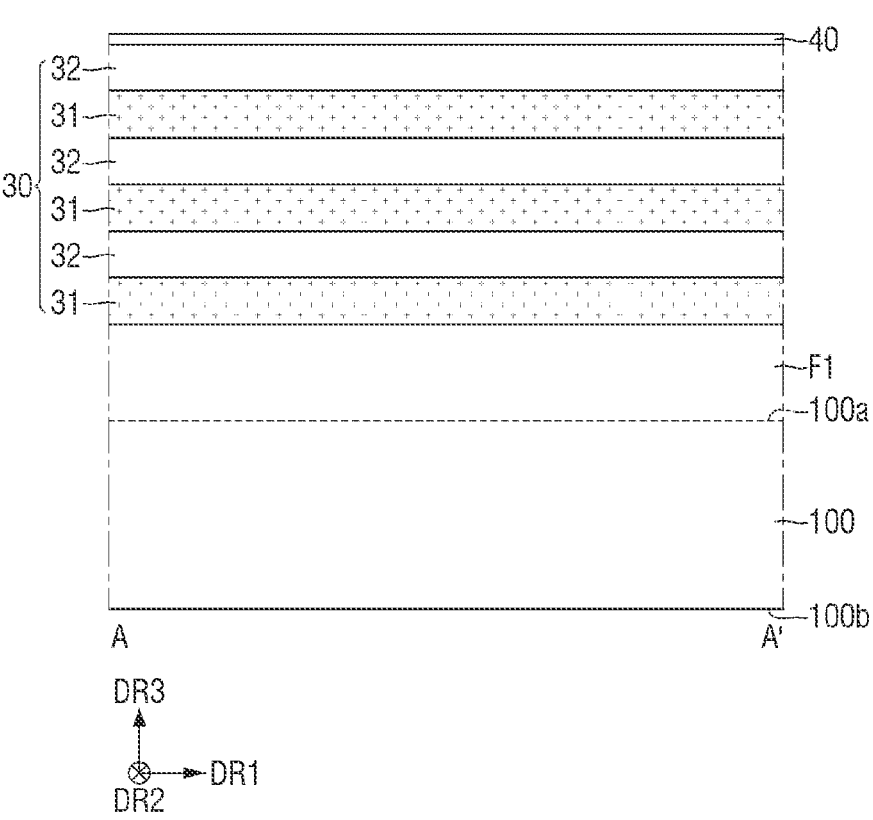
Figure 16:
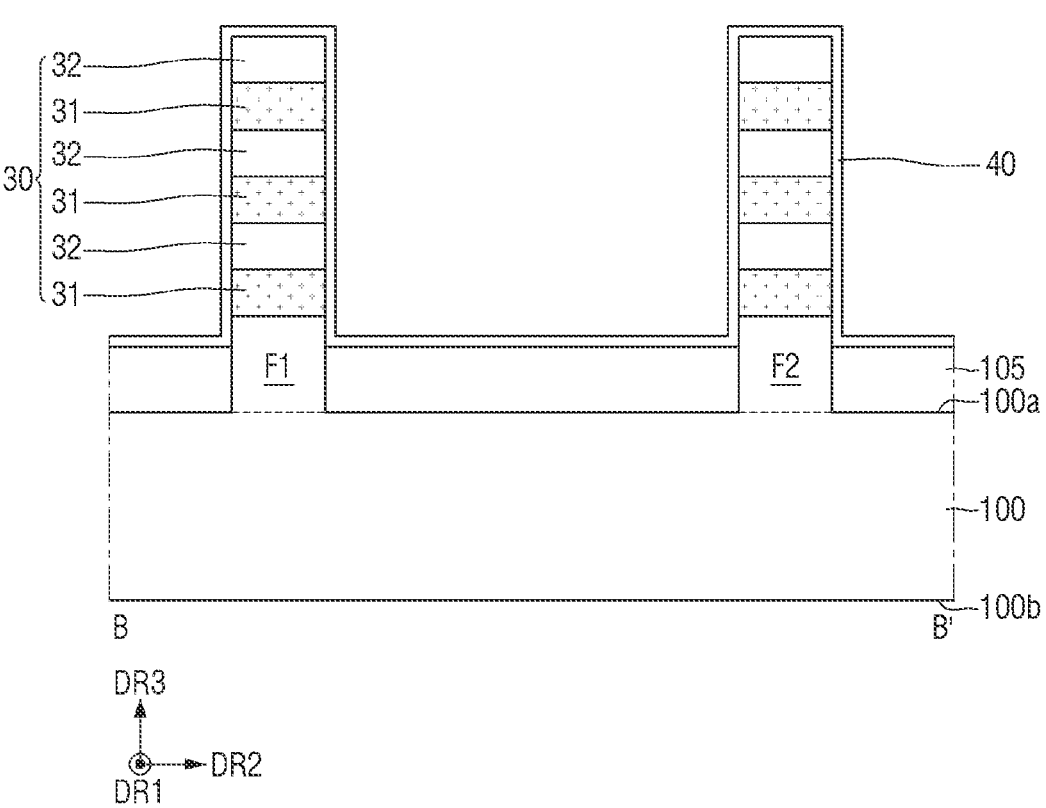
Figure 17:
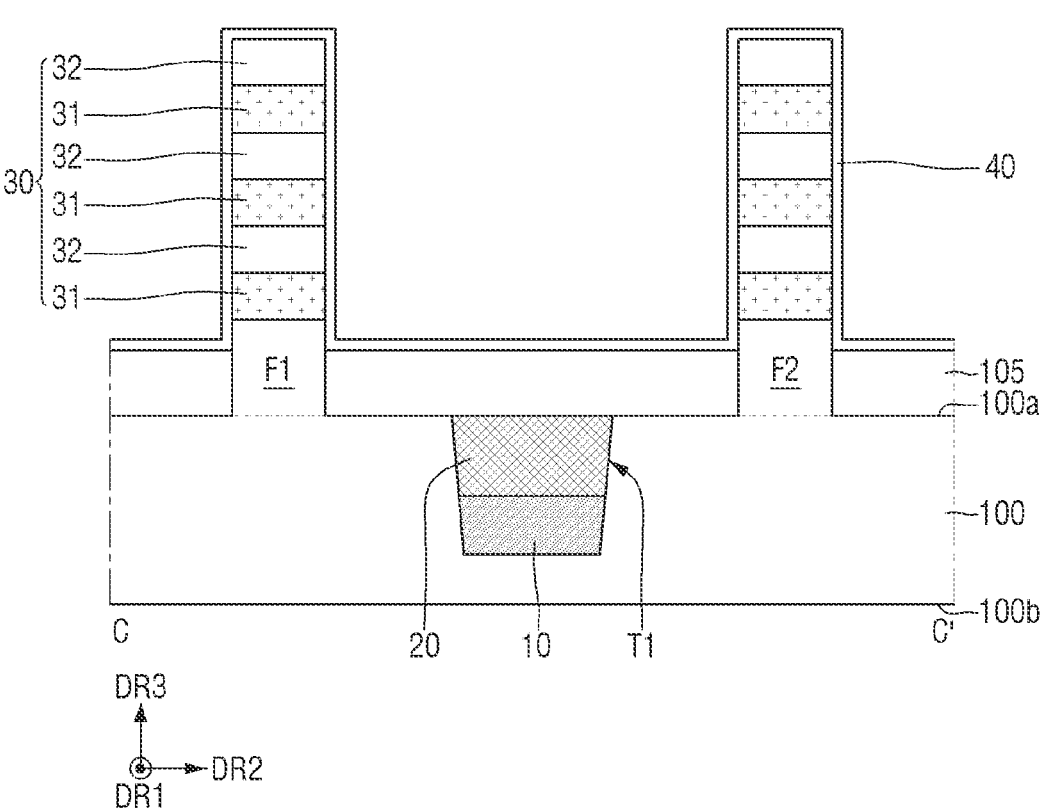

Referring to FIGS. 15 to 17, the field insulating layer 105 may be formed on the upper surface 100a of the substrate 100 and the upper surface of the second sacrificial layer 20. The field insulating layer 105 may surround sidewalls of each of the first active pattern F1 and the second active pattern F2. For example, the upper surface of each of the first active pattern F1 and the second active pattern F2 may be formed to be higher than the upper surface of the field insulating layer 105. Subsequently, a pad oxide layer 40 may be formed to cover the upper surface of the field insulating layer 105, sidewalls of each of the exposed first and second active patterns F1 and F2, and the sidewalls and the upper surface of the stacked structure 30. For example, the pad oxide layer 40 may be formed to be conformal. The pad oxide layer 40 may include, for example, silicon oxide (SiO$_2$).

Figure 18:
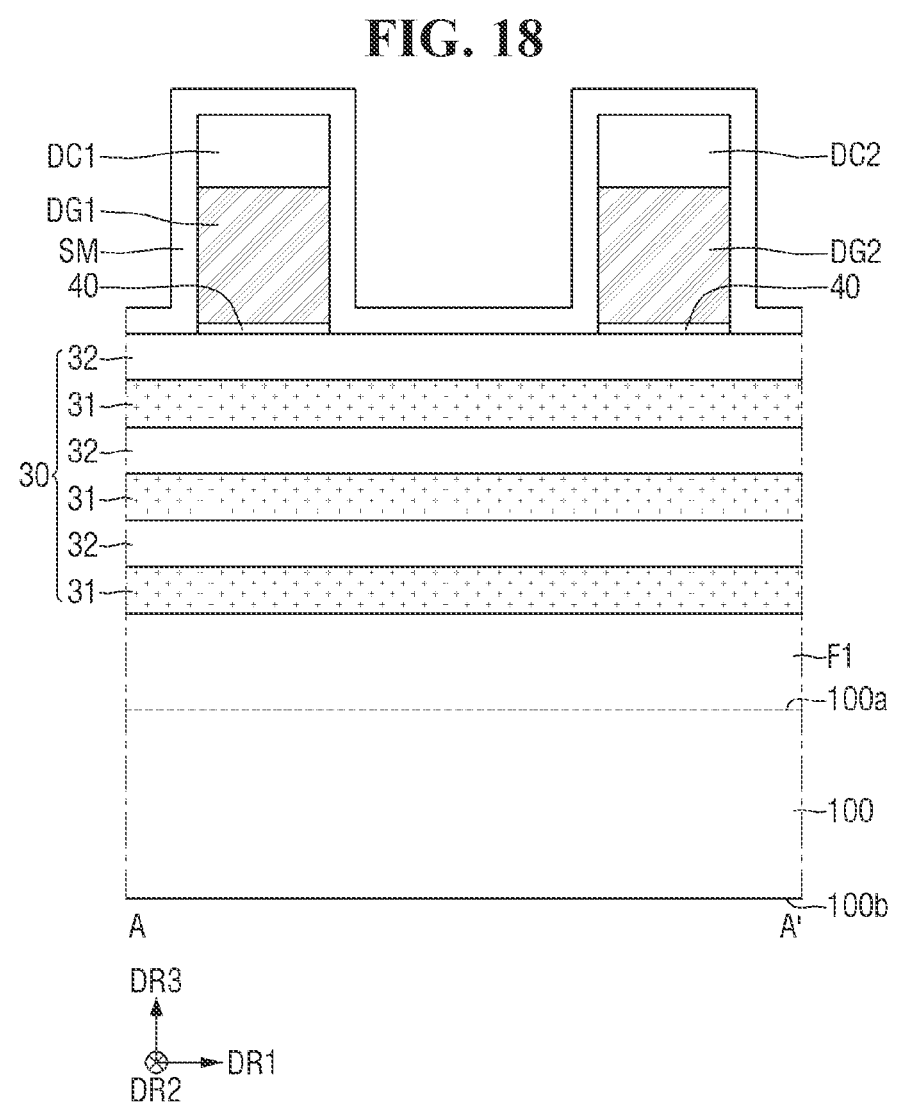
Figure 19:
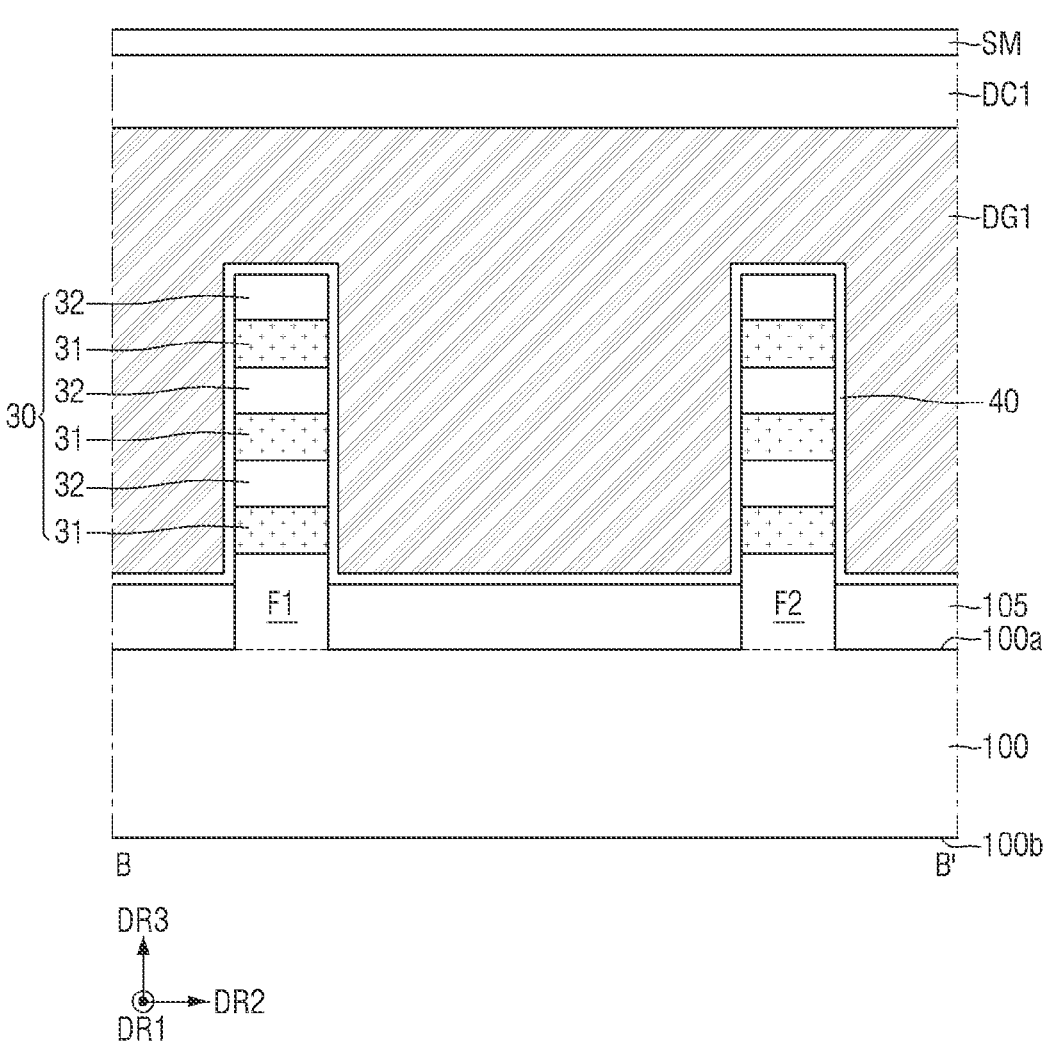
Figure 20:
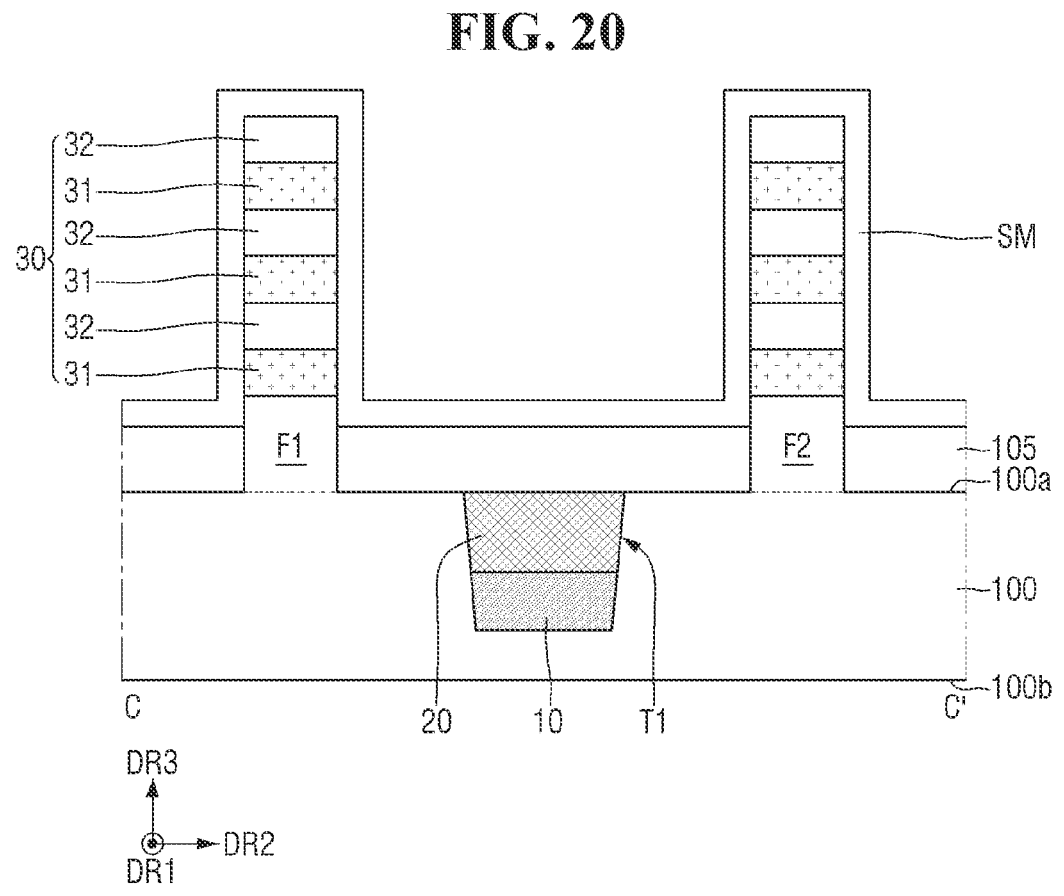

Referring to FIGS. 18 to 20, first and second dummy gates DG1 and DG2 and first and second dummy capping patterns DC1 and DC2, which are extending in the second horizontal direction DR2 on the pad oxide layer 40, may be formed on the stacked structure 30 and the field insulating layer 105. For example, the second dummy gate DG2 may be spaced apart from the first dummy gate DG1 in the first horizontal direction DR1. The first dummy capping pattern DC1 may be disposed on the first dummy gate DG1. The second dummy capping pattern DC2 may be disposed on the second dummy gates DG2. While the first and second dummy gates DG1 and DG2 and the first and second dummy capping patterns DC1 and DC2 are being formed, the other pad oxide layer 40 except for a portion overlapped with each of the first and second dummy gates DG1 and DG2 in the vertical direction DR3 may be removed on the substrate 100.

Subsequently, a spacer material layer SM may be formed to cover sidewalls of each of the first and second dummy gates DG1 and DG2, sidewalls and an upper surface of each of the first and second dummy capping patterns DC1 and DC2, sidewalls and an upper surface of the exposed stacked structure 30, and the upper surface of the field insulating layer 105. For example, the spacer material layer SM may be formed to be conformal. The spacer material layer SM may include at least one of, for example, silicon nitride (SiN), silicon oxycarbonitride (SiOCN), silicon boron carbonitride (SiBCN), silicon carbonitride (SiCN), silicon oxynitride (SiON), or their combination.

Figure 21:
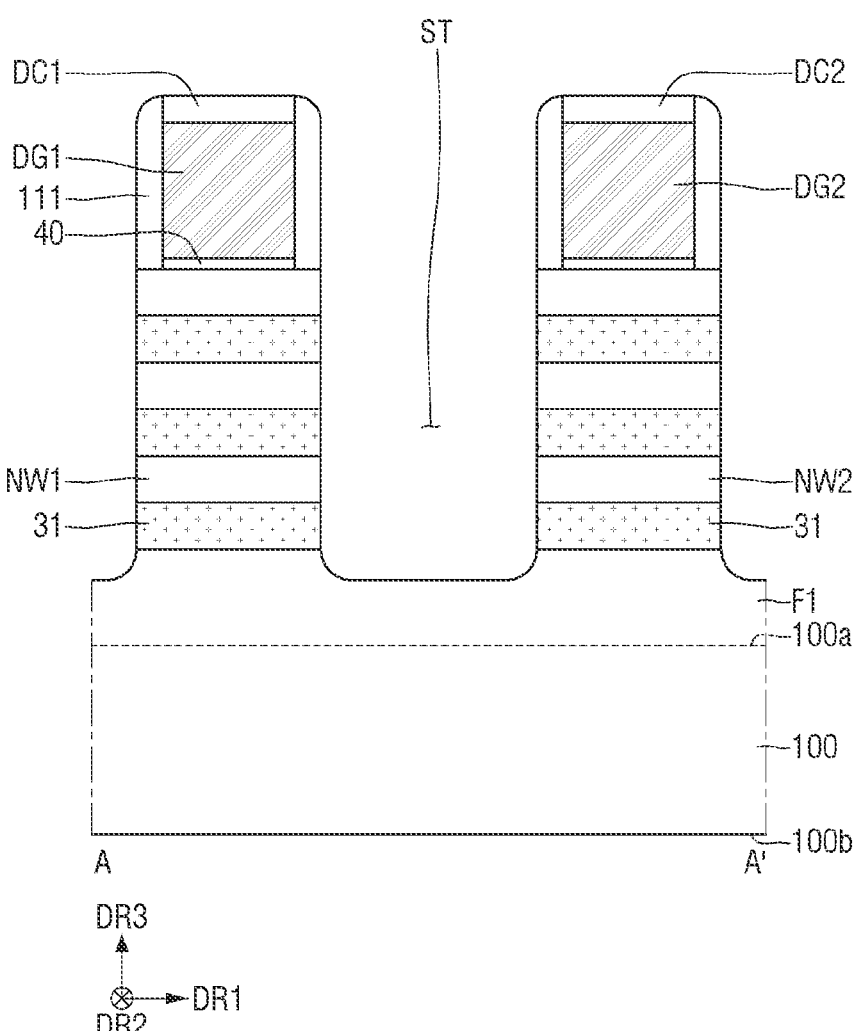
Figure 22:
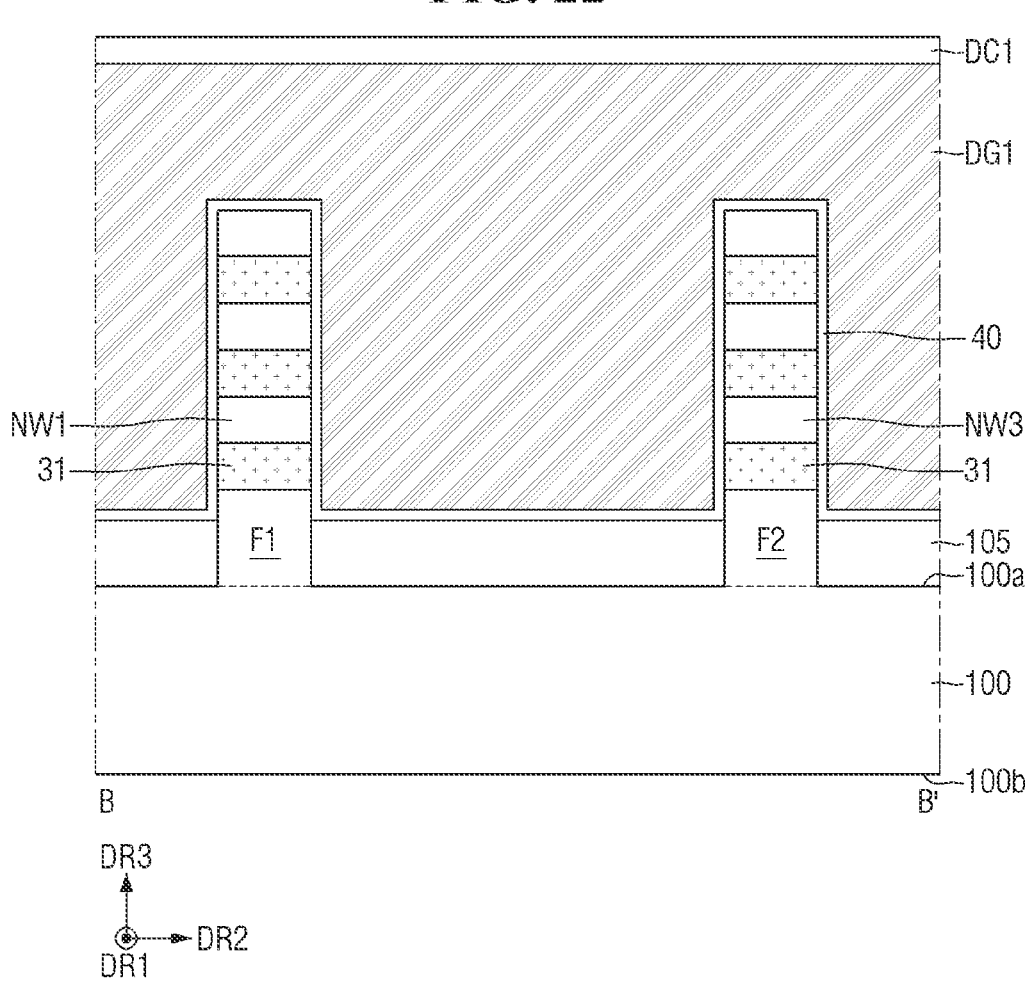
Figure 23:
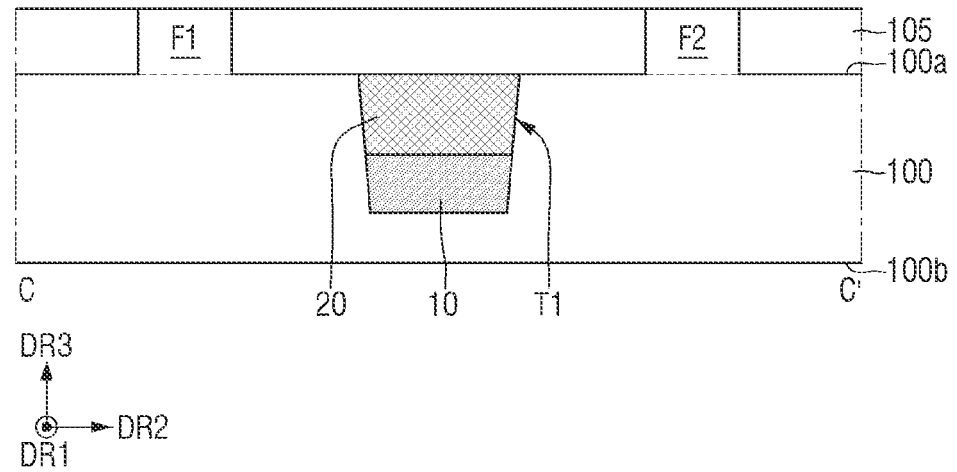

Referring to FIGS. 21 to 23, the stacked structure (30 of FIGS. 18 to 20) may be etched using the first and second dummy gates DG1 and DG2 and the first and second dummy capping patterns DC1 and DC2 as masks to form a source/drain trench ST. For example, the source/drain trench ST may extend to the inside of each of the first active pattern F1 and the second active pattern F2. While the source/drain trench ST is being formed, the spacer material layer (SM of FIGS. 18 to 20), which is formed on the upper surface of each of the first and second dummy capping patterns DC1 and DC2, and each of the first and second dummy capping patterns DC1 and DC2 may be etched.

For example, the spacer material layer (SM of FIGS. 18 to 20) remaining on the sidewalls of each of the first and second dummy capping patterns DC1 and DC2 and the first and second dummy gates DG1 and DG2 may be defined as the gate spacer 111. For example, after the source/drain trench ST is formed, the second semiconductor layer (32 of FIGS. 18 to 20) remaining below the first dummy gate DG1 may be defined as a first plurality of nanosheets NW1 on the first active pattern F1. After the source/drain trench ST is formed, the second semiconductor layer (12 of FIGS. 18 to 20) remaining below the second dummy gate DG2 may be defined as a second plurality of nanosheets NW2 on the first active pattern F1. After the source/drain trench ST is formed, the second semiconductor layer (12 of FIGS. 18 to 20) remaining below the first dummy gate DG1 may be defined as a third plurality of nanosheets NW3 on the second active pattern F2.

Figure 24:
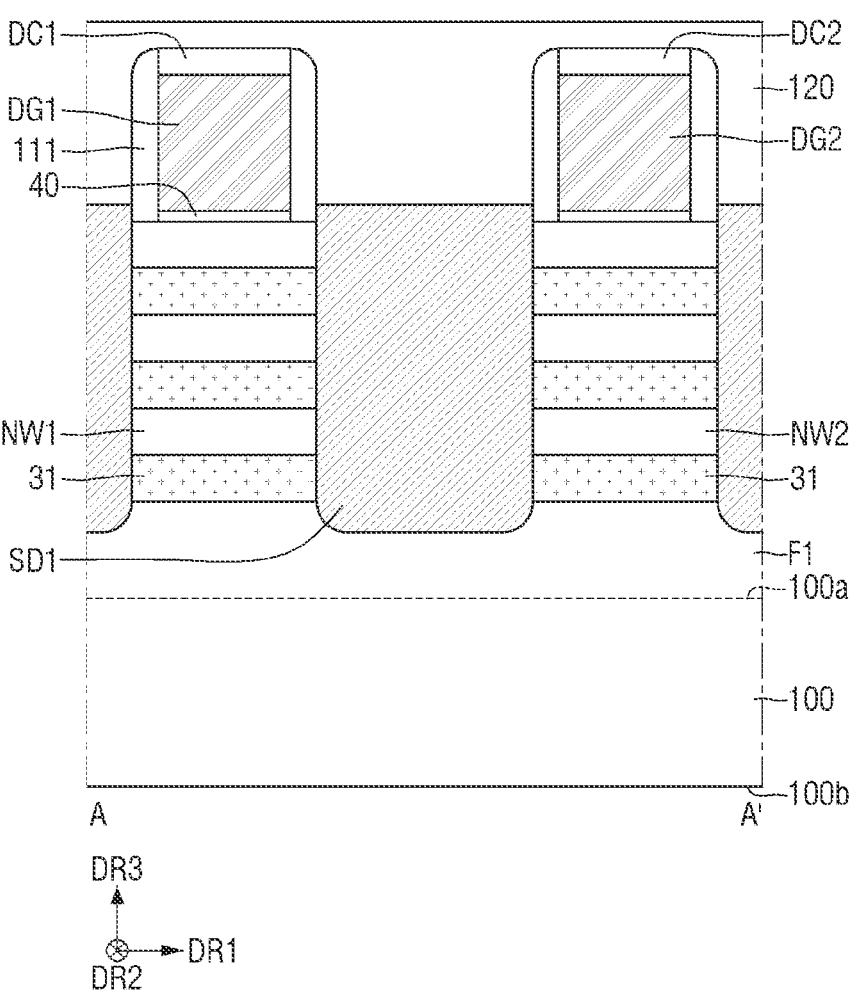
Figure 25:
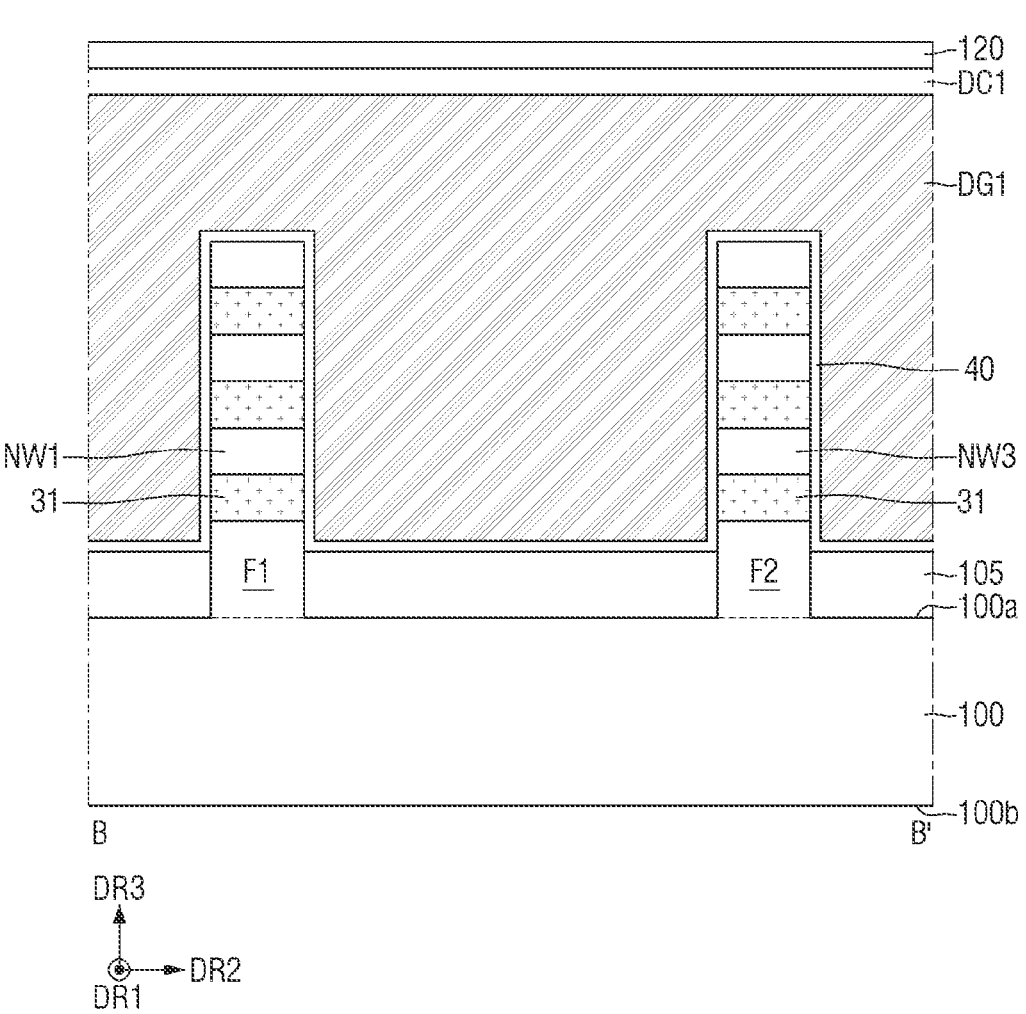
Figure 26:
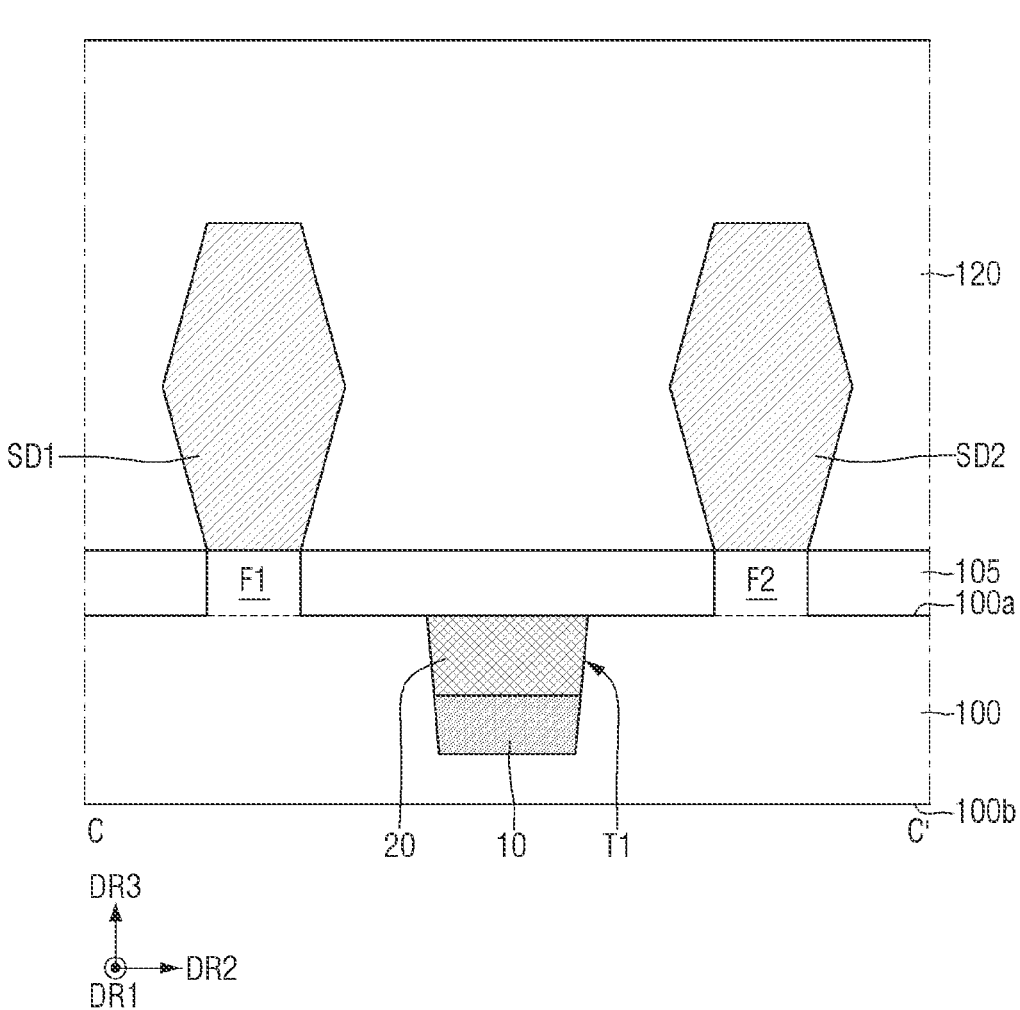

Referring to FIGS. 24 to 26, the first source/drain region SD1 may be formed inside the source/drain trench ST formed on the first active pattern F1. In addition, the second source/drain region SD2 may be formed inside the source/drain trench ST formed on the second active pattern F2. Subsequently, the first upper interlayer insulating layer 120 may be formed to cover the sidewalls and the upper surface of each of the first and second source/drain regions SD1 and SD2, the gate spacer 111, and each of the first and second dummy capping patterns DC1 and DC2.

Figure 27:
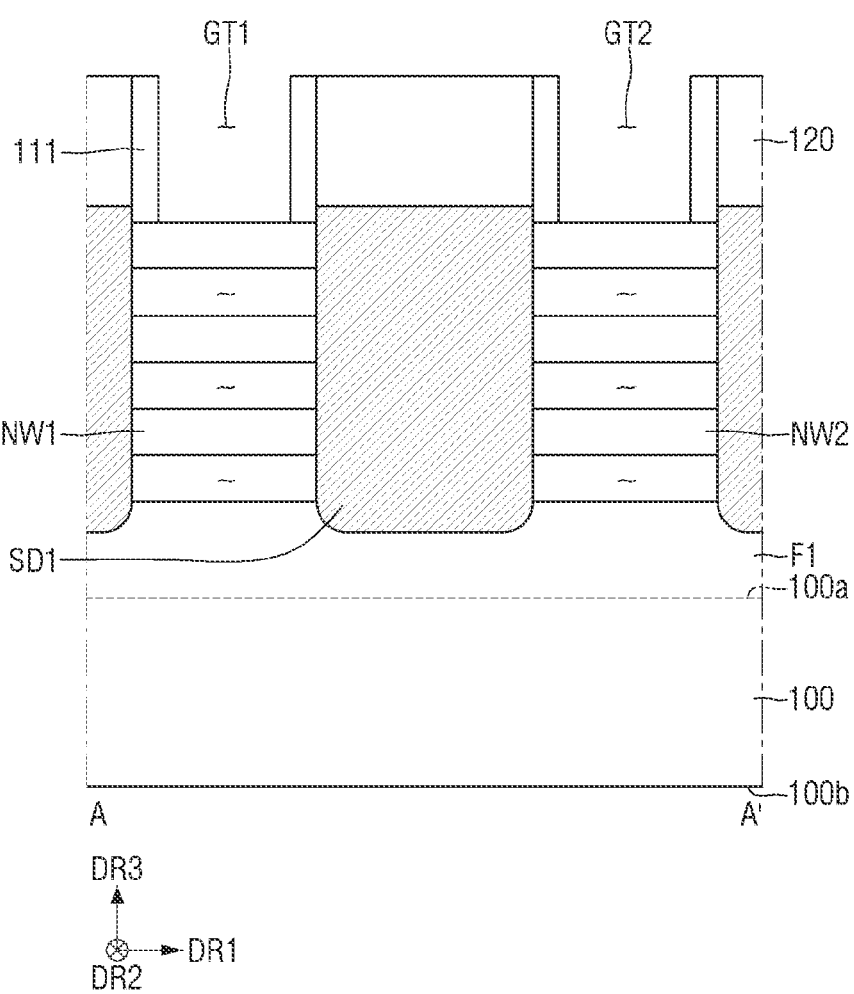
Figure 28:
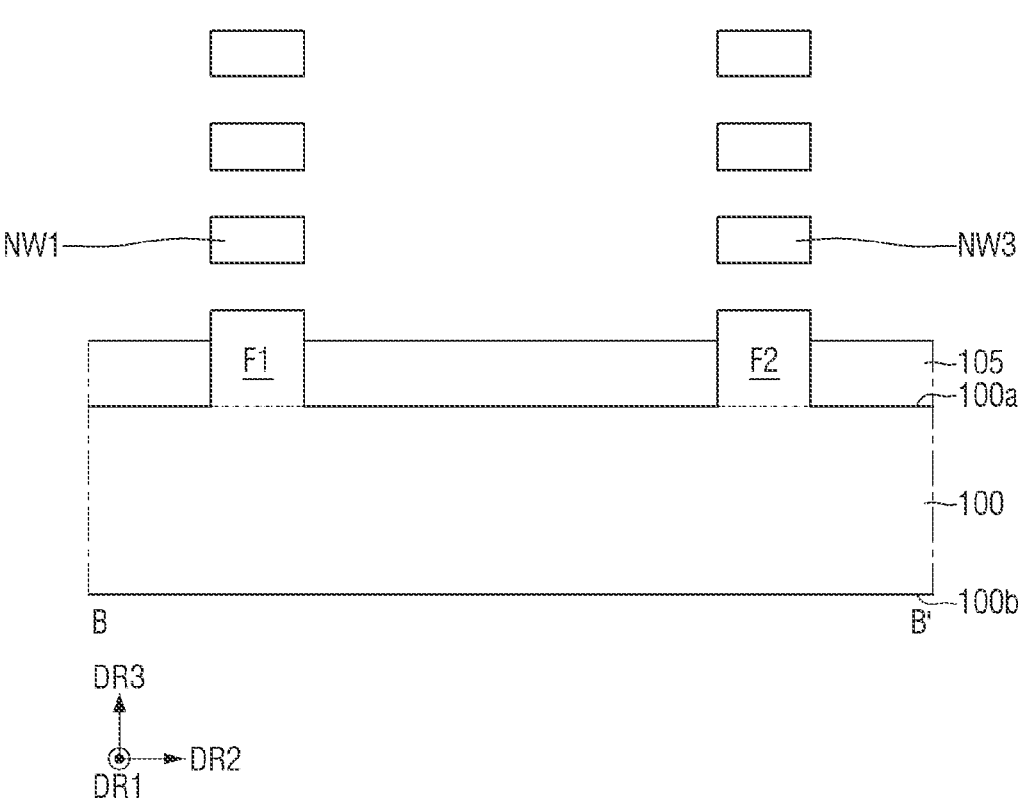
Figure 29:
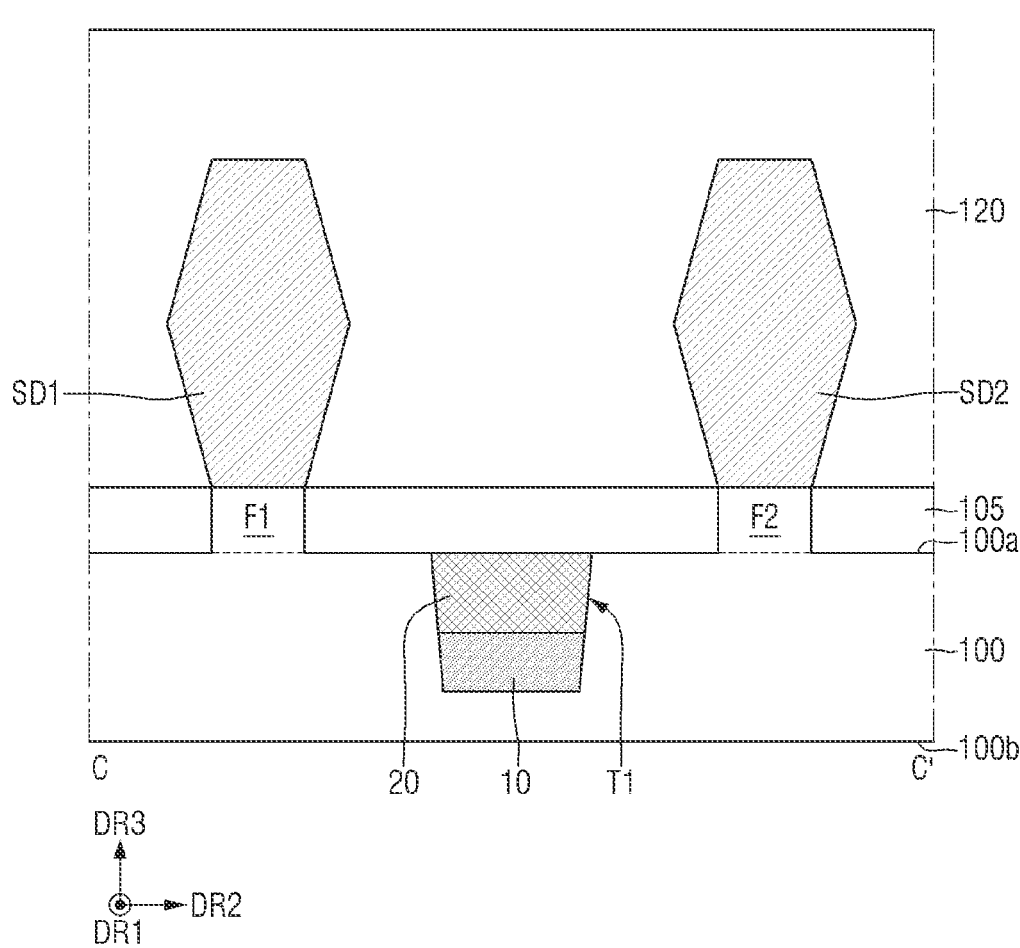

Referring to FIGS. 27 to 29, an upper surface of each of the first and second dummy gates (DG1 and DG2 of FIGS. 24 and 25) may be exposed through a planarization process. Then, each of the first and second dummy gates (DG1 and DG 2 of FIGS. 24 and 25), the pad oxide layer (40 of FIGS. 24 and 25) and the first semiconductor layer (31 of FIGS. 24 and 25) may be removed. A portion from which the first dummy gate (DG1 of FIGS. 24 and 25) is removed may be defined as a first gate trench GT1. A portion from which the second dummy gates (DG2 of FIG. 24) is removed may be defined as a second gate trench GT2.

Figure 30:
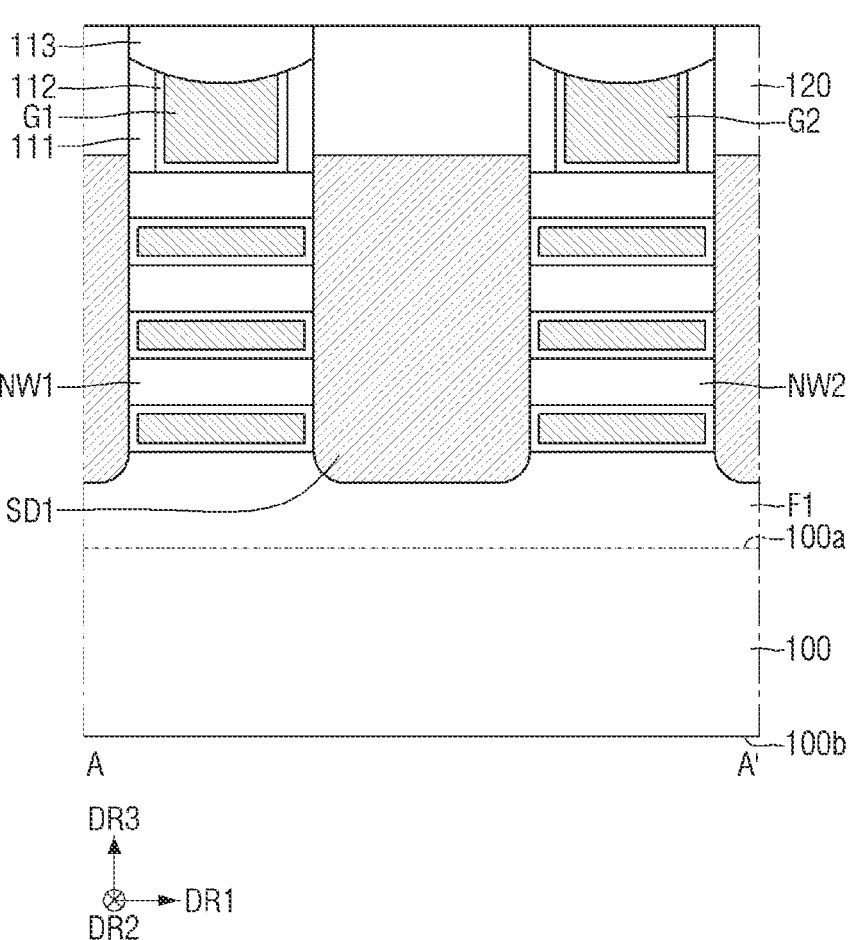
Figure 31:
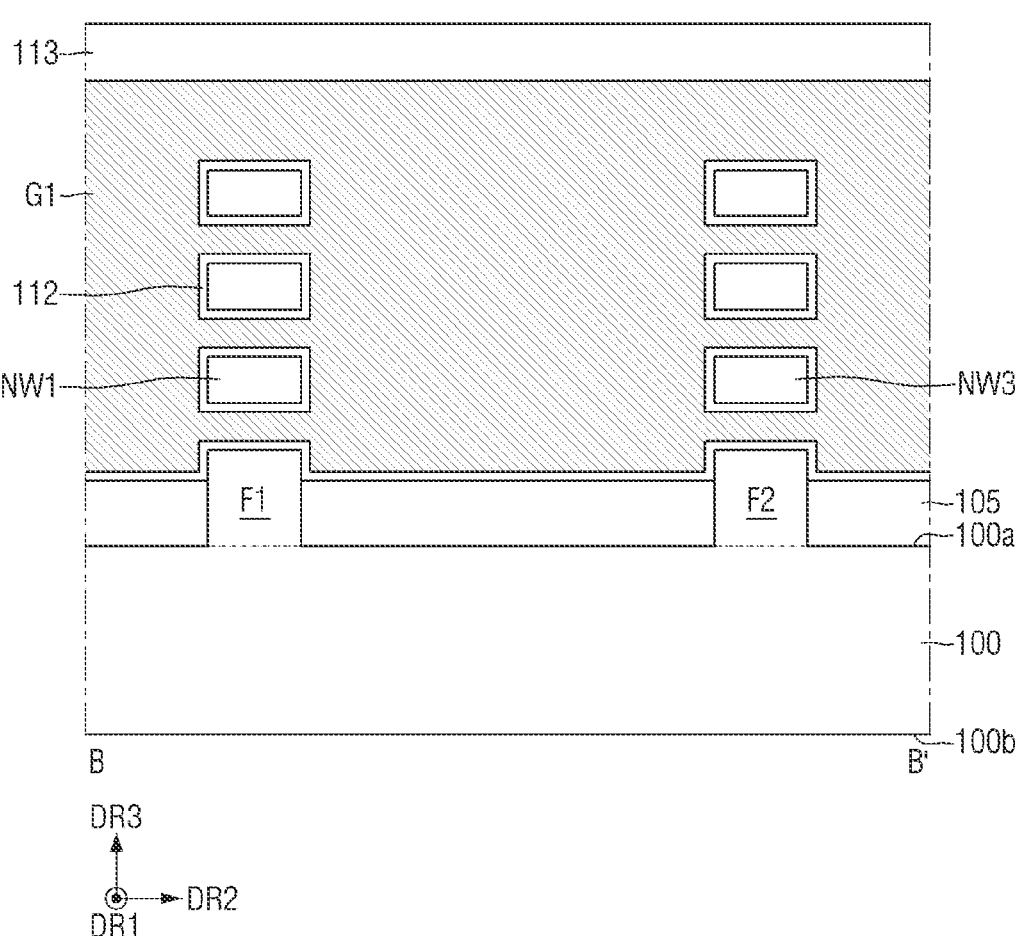

Referring to FIGS. 30 and 31, the gate insulating layer 112 and the first gate electrode G1 may be formed inside the first gate trench (GT1 of FIG. 27). In addition, the gate insulating layer 112 and the second gate electrode G2 may be formed inside the second gate trench (GT2 of FIG. 27). Then, the capping pattern 113 may be formed on the gate spacer 111, the gate insulating layer 112 and the first gate electrode G1. In addition, the capping pattern 113 may be formed on the gate spacer 111, the gate insulating layer 112 and the second gate electrode G2.

Figure 32:
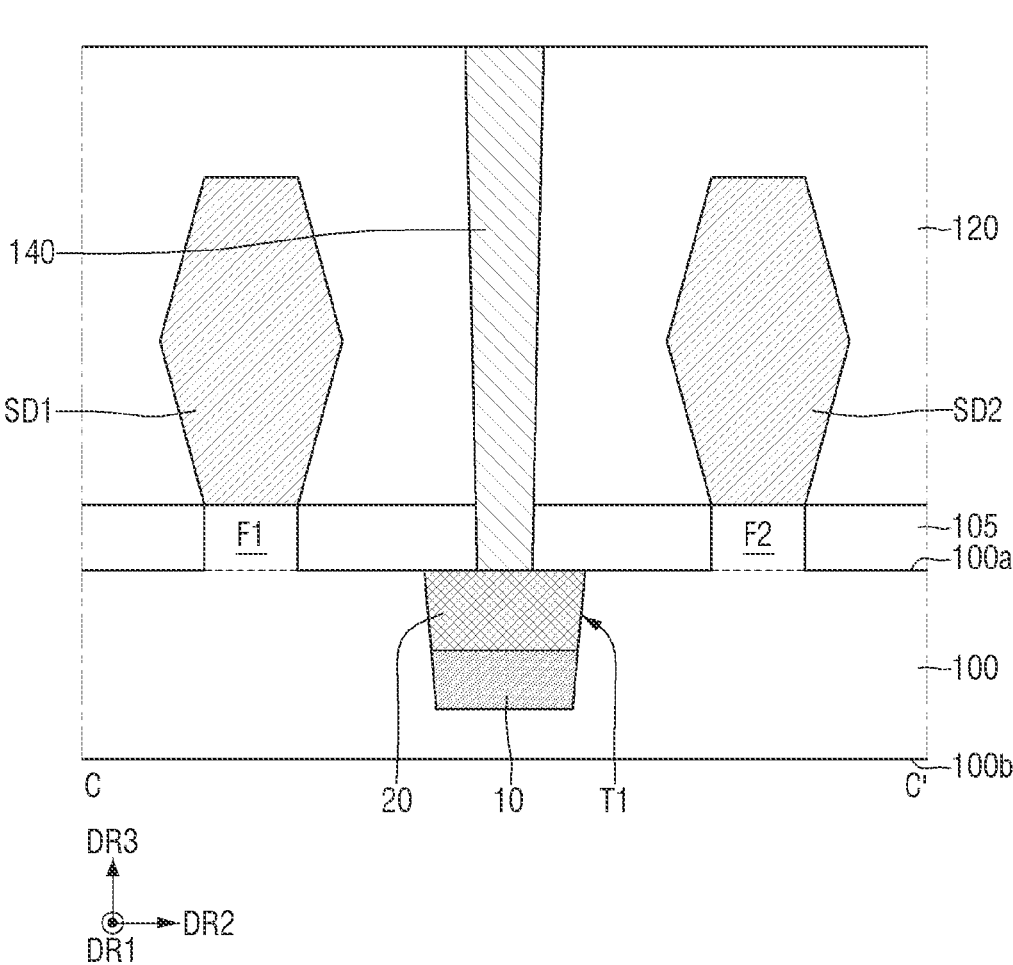

Referring to FIG. 32, the second through-via 140 passing through each of the first upper interlayer insulating layer 120 and the field insulating layer 105 in the vertical direction DR3 may be formed between the first source/drain region SD1 and the second source/drain region SD2. The second through-via 140 may be spaced apart from each of the first and second source/drain regions SD1 and SD2 in the second horizontal direction DR2. The second through-via 140 may extend to the upper surface of the second sacrificial layer 20. That is, the lower surface of the second through-via 140 may be in contact with the upper surface of the second sacrificial layer 20. For example, as the second through-via 140 becomes adjacent to the upper surface of the second sacrificial layer 20, the width of the second through-via 140 in the second horizontal direction DR2 may be continuously reduced. For example, the sidewall of the second through-via 140 may have a constant slope profile.

Figure 33:
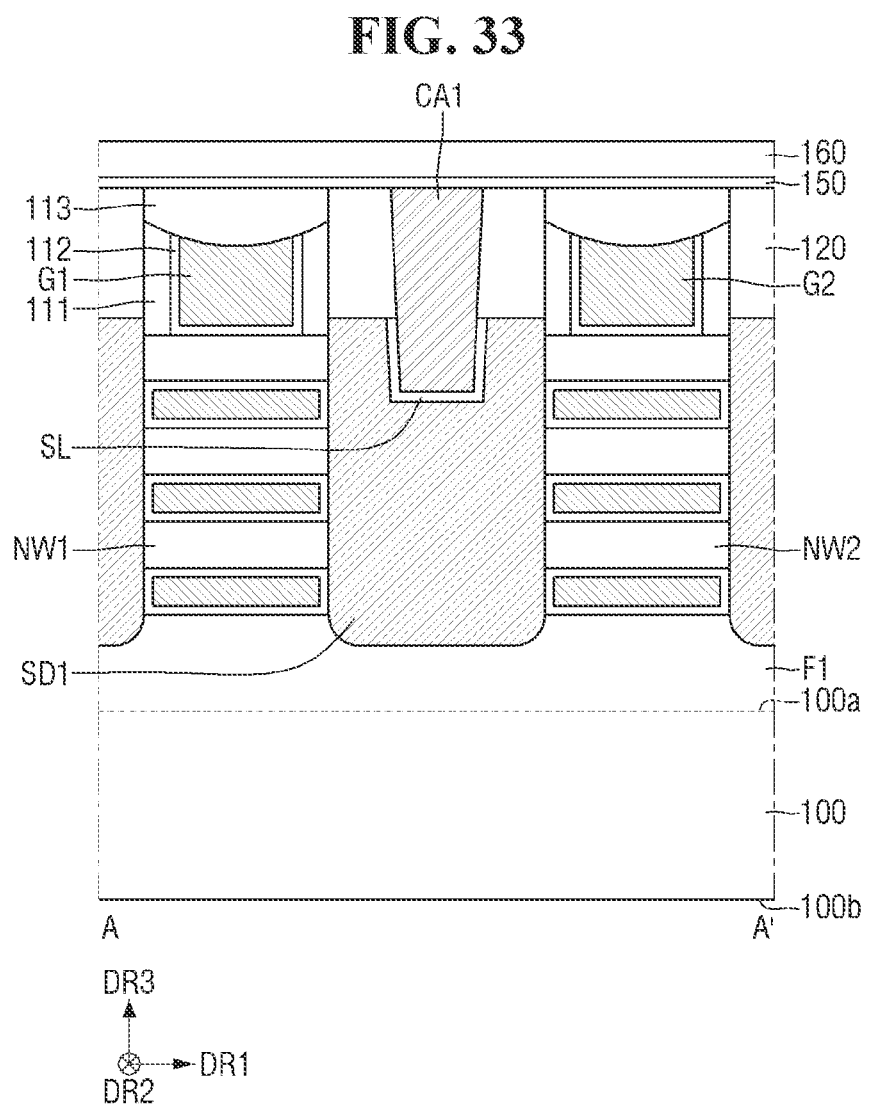
Figure 34:
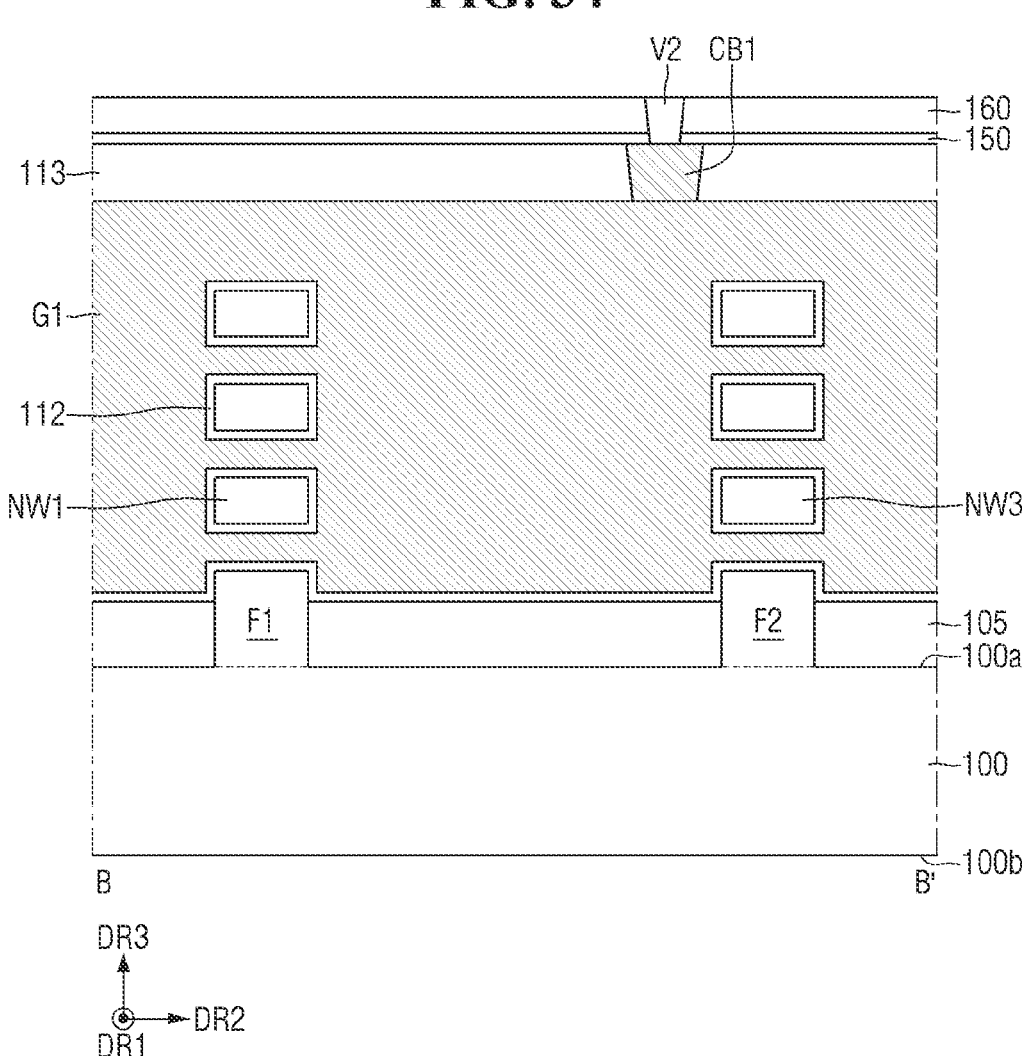
Figure 35:
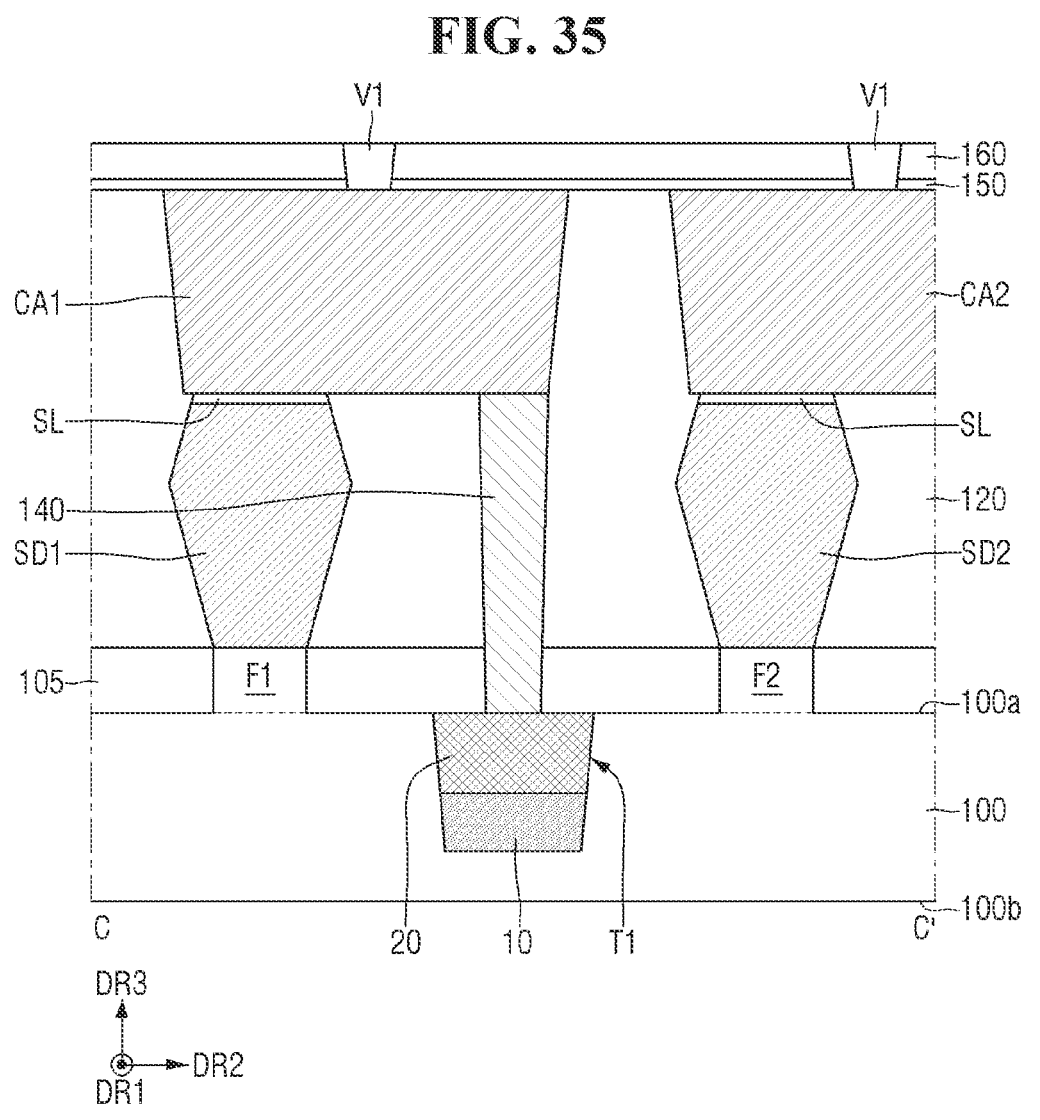

Referring to FIGS. 33 to 35, the first source/drain contact CA1 and the second source/drain contact CA2 may be formed inside the first upper interlayer insulating layer 120. For example, each of the first source/drain contact CA1 and the second source/drain contact CA2 may extend in the second horizontal direction DR2 between the first gate electrode G1 and the second gate electrode G2. The second source/drain contact CA2 may be spaced apart from the first source/drain contact CA1 in the second horizontal direction DR2. The first source/drain contact CA1 may be connected to each of the first source/drain region SD1 and the second through-via 140. The second source/drain contact CA2 may be connected to the second source/drain region SD2.

For example, the upper surface of each of the first source/drain contact CA1 and the second source/drain contact CA2 may be formed on the same plane as the upper surface of the first upper interlayer insulating layer 120. The silicide layer SL may be formed between the first source/drain contact CA1 and the first source/drain region SD1 and between the second source/drain contact CA2 and the second source/drain region SD2. The first gate contact CB1 that is connected to the first gate electrode G1 by passing through the capping pattern 113 in the vertical direction DR3 may be formed. For example, the upper surface of the first gate contact CB1 may be formed on the same plane as the upper surface of the first upper interlayer insulating layer 120.

Subsequently, the etch stop layer 150 and the second upper interlayer insulating layer 160 may be sequentially formed on the upper surface of each of the first upper interlayer insulating layer 120, the capping pattern 113, the first gate contact CB1, and the first and second source/drain contacts CA1 and CA2. Then, the first via V1 connected to any one of the first source/drain contact CA1 and the second source/drain contact CA2 by passing through the second upper interlayer insulating layer 160 and the etch stop layer 150 in the vertical direction DR3 may be formed. In addition, the second via V2 connected to the first gate contact CB1 by passing through the second upper interlayer insulating layer 160 and the etch stop layer 150 in the vertical direction DR3 may be formed.

Figure 36:
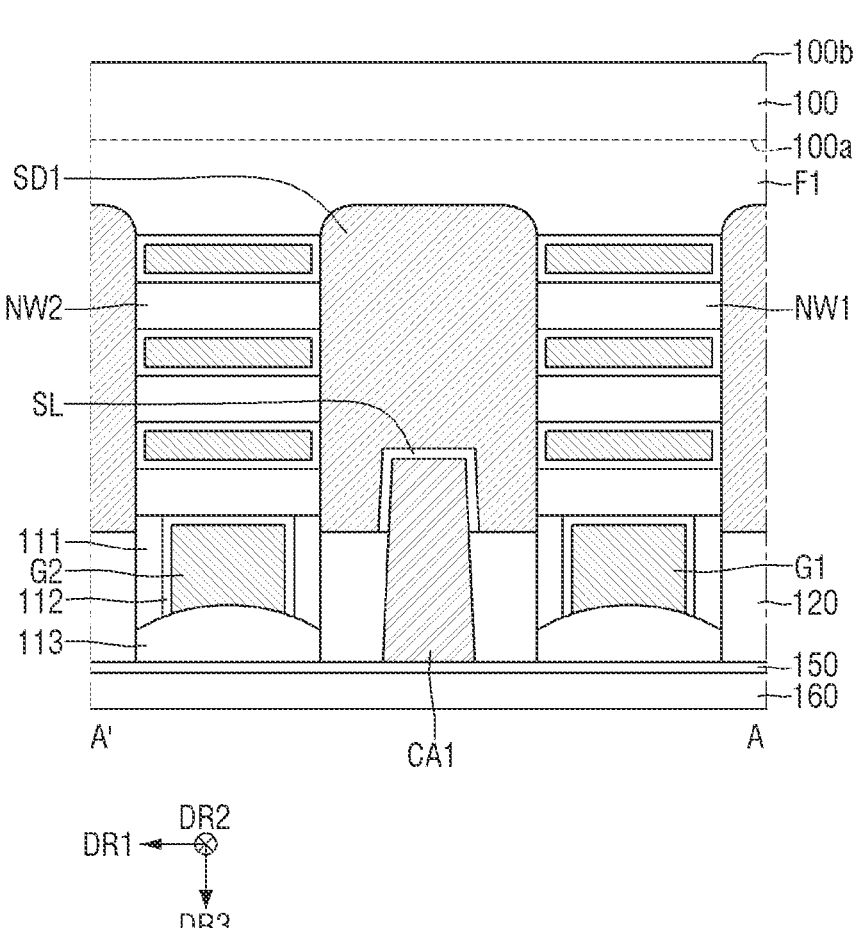
Figure 37:
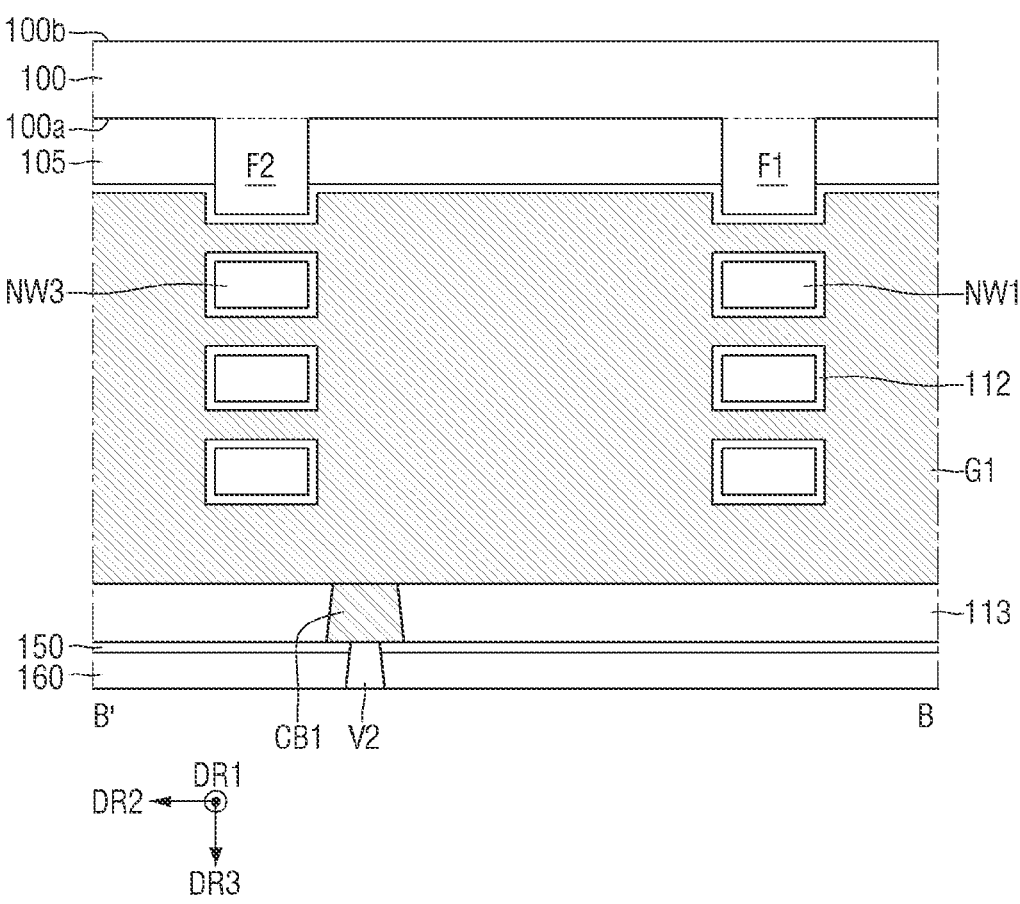
Figure 38:
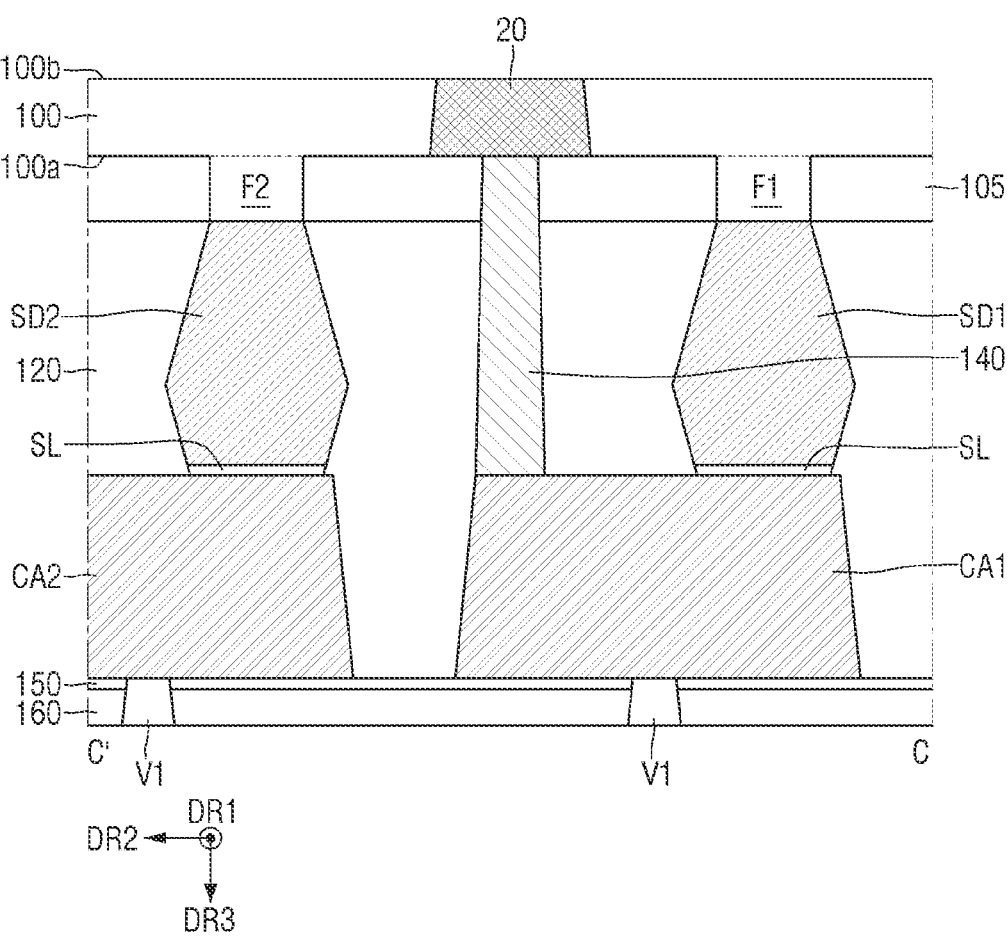

Referring to FIGS. 36 to 38, after the process shown in FIGS. 33 to 35 is performed, upper and lower portions may be inverted. Then, a portion of the substrate 100 and the first sacrificial layer (10 of FIG. 35) may be etched through a planarization process to expose the second sacrificial layer 20. For example, while a portion of the substrate 100 and the first sacrificial layer (10 of FIG. 35) are being etched, a time point at which the surface of the second sacrificial layer 20 is exposed may be used as a time point at which the etching of the substrate 100 is stopped. For example, the lower surface 100b of the substrate 100 and the exposed surface of the second sacrificial layer 20 may be formed on the same plane.

Figure 39:
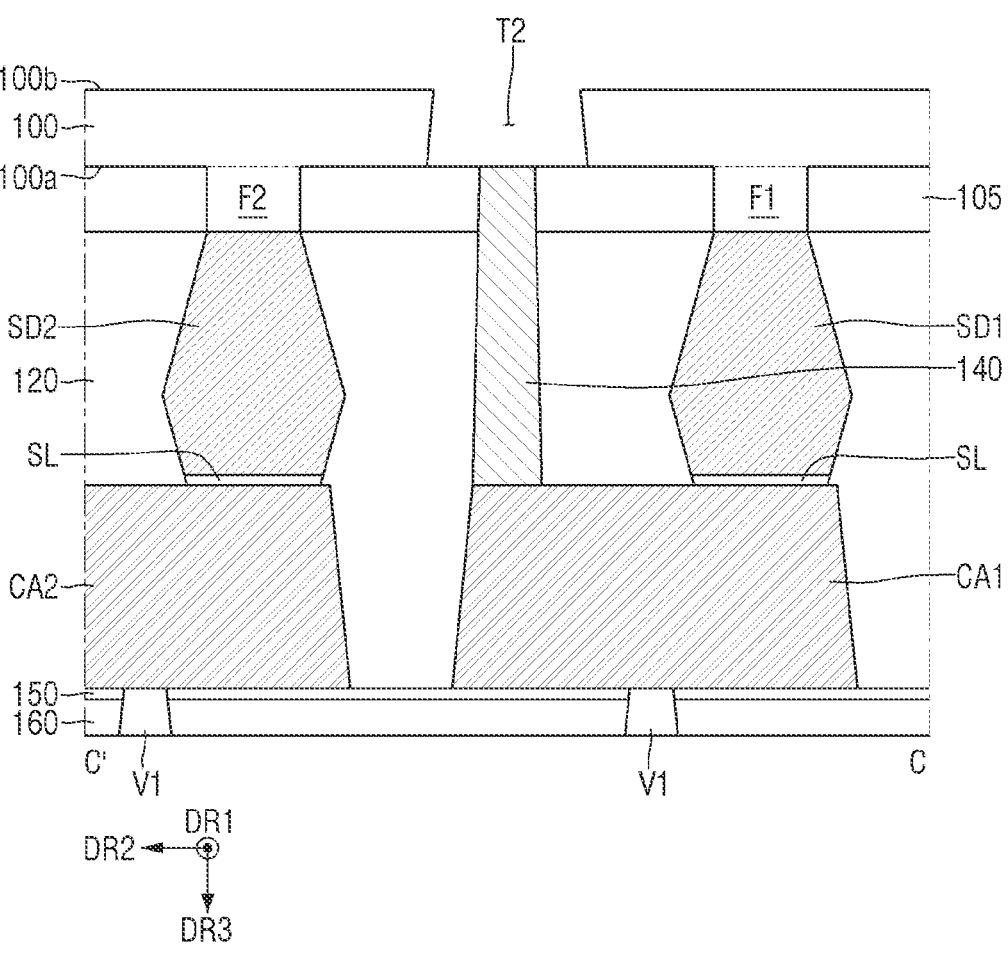

Referring to FIG. 39, the second sacrificial layer (20 of FIG. 38) may be etched. As a result, a second trench T2 may be formed inside the substrate 100. For example, the field insulating layer 105 and the second through-via 140 may be exposed through a bottom surface of the second trench T2.

Figure 40:
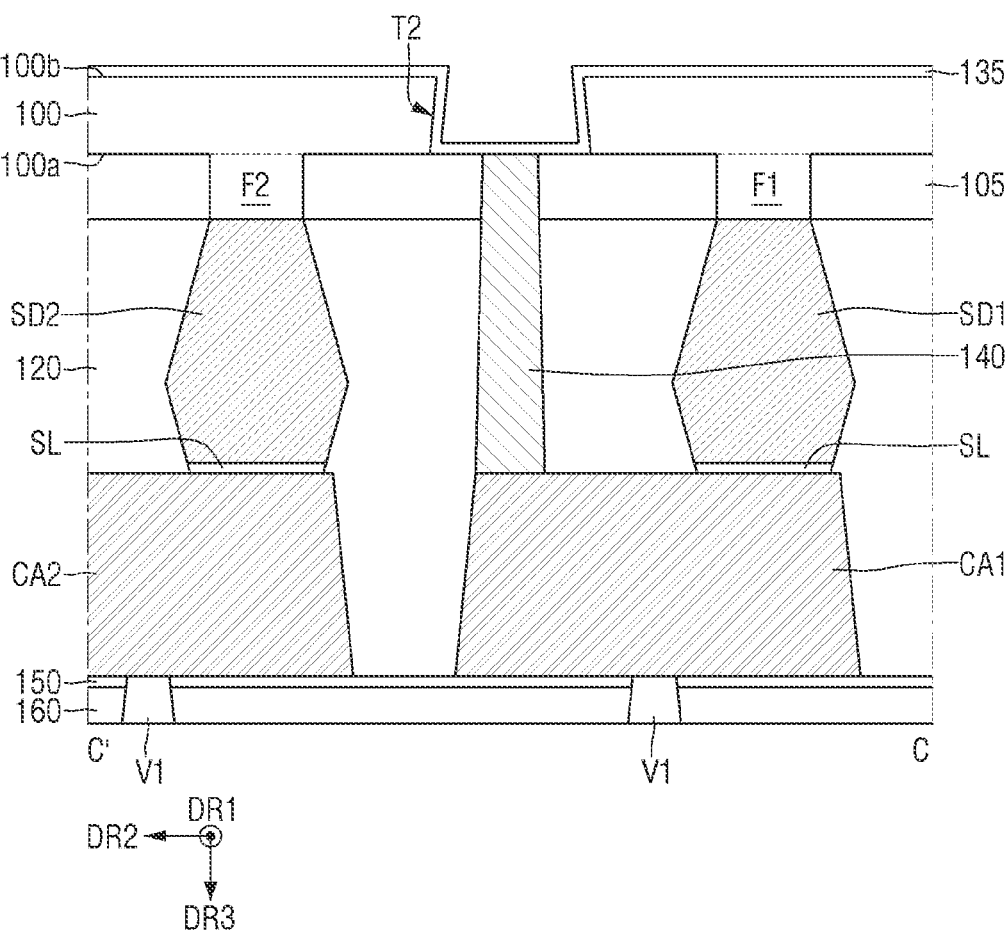

Referring to FIG. 40, the insulating liner 135 may be formed along sidewalls and the bottom surface of the second trench T2. For example, the insulating liner 135 may be formed on the lower surface 100b of the substrate 100. For example, the insulating liner 135 may be formed to be conformal.

Figure 41:
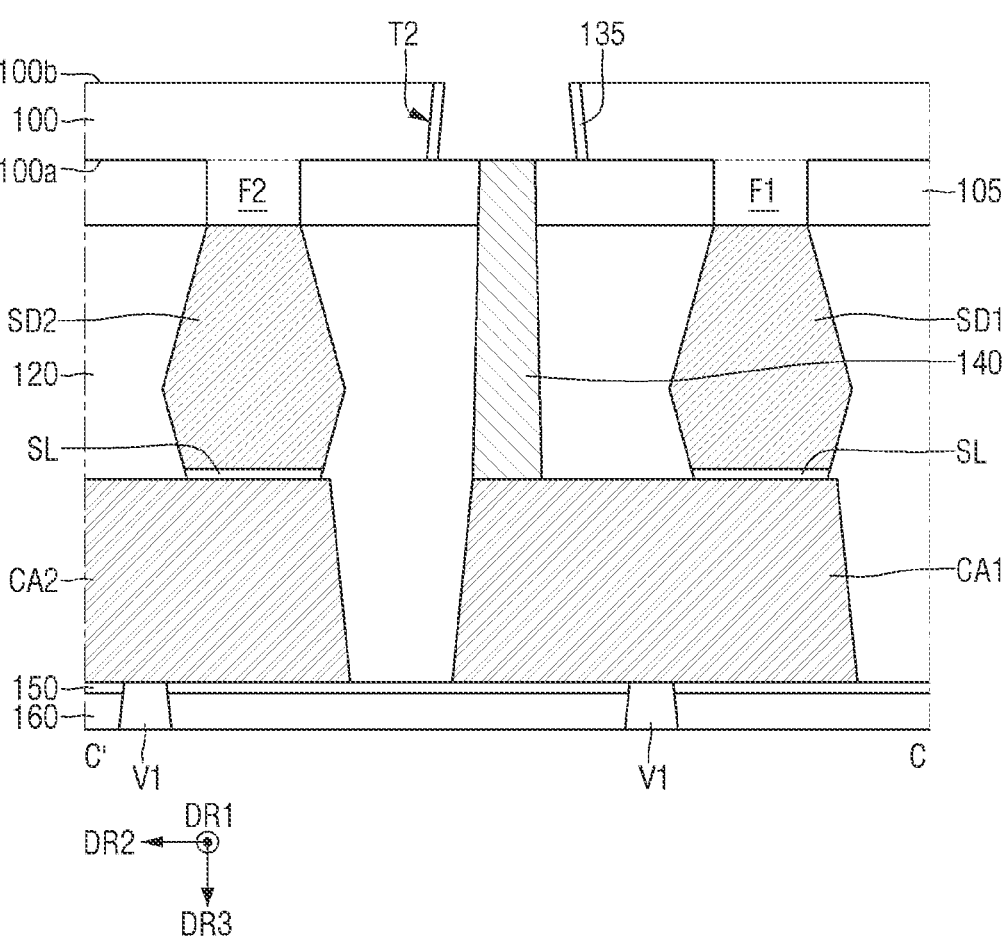

Referring to FIG. 41, an etch back process may be performed so that a portion of the insulating liner 135 may be etched. After the etch back process is performed, the insulating liner 135 to be formed on the bottom surface of the second trench T2 and the lower surface 100b of the substrate 100 may be removed. However, after the etch back process is performed, the insulating liner 135 formed on the sidewall of the second trench T2 may remain.

Figure 42:
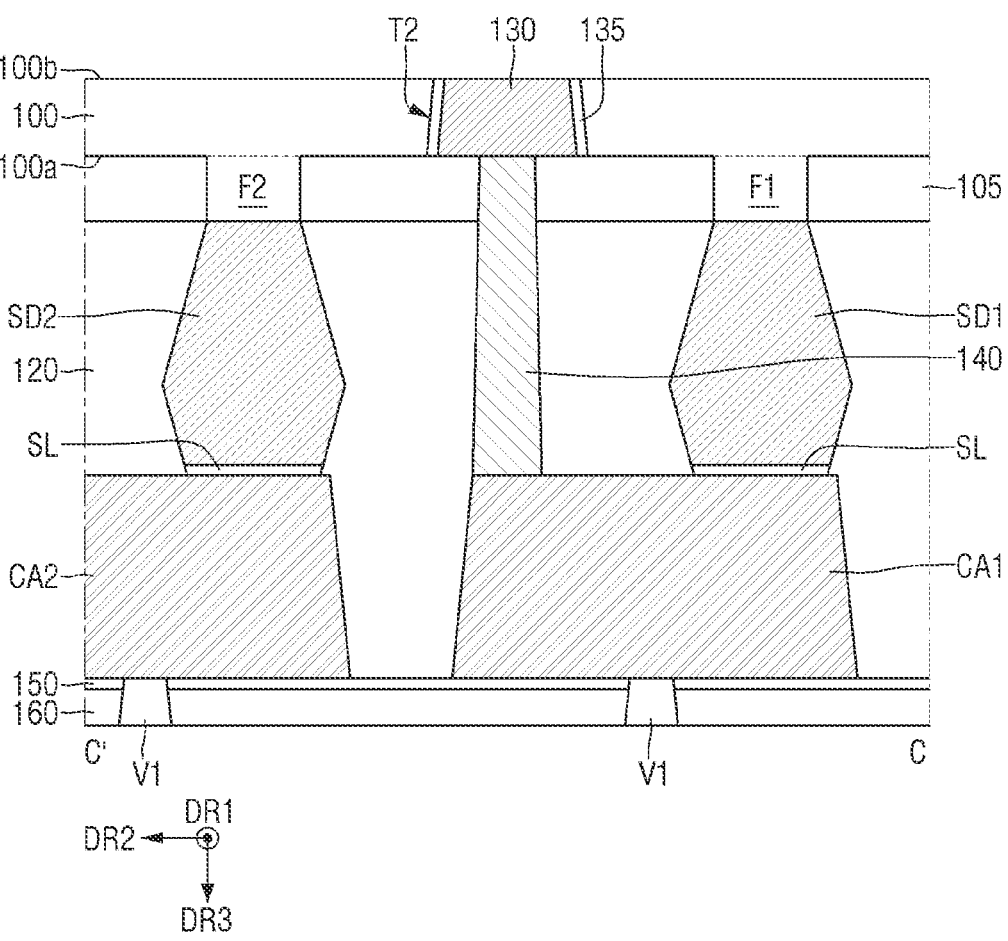

Referring to FIG. 42, the first through-via 130 may be formed to fill the inside of the second trench T2 on the insulating liner 135. For example, the first through-via 130 may be formed on the lower surface 100b of the substrate 100. Then, the lower surface 100b of the substrate 100 and the insulating liner 135 may be exposed through a planarization process. Therefore, the exposed surface of the first through-via 130, the exposed surface of the insulating liner 135, and the lower surface 100b of the substrate 100 may be respectively formed on the same plane. The first through-via 130 may be in contact with the second through-via 140.

Referring to FIGS. 2 to 4, the lower interlayer insulating layer 170 may be formed on each of the exposed surface of the first through-via 130, the exposed surface of the insulating liner 135, and the lower surface 100b of the substrate 100. Then, the lower wiring pattern 180 may be formed inside the lower interlayer insulating layer 170. The lower wiring pattern 180 may be connected to the first through-via 130. Then, the semiconductor device shown in FIGS. 2 to 4 may be manufactured by inversion of the upper and lower portions.

In the method for manufacturing a semiconductor device according to some implementations of the present disclosure, the lower surface 100b of the substrate 100 may be etched after the second sacrificial layer 20 is formed inside the substrate 100 and the upper and lower portions are inverted. While the lower surface 100b of the substrate 100 is being etched, a time point at which the surface of the second sacrificial layer 20 is exposed may be used as a time point at which etching of the lower surface 100b of the substrate 100 is stopped. Therefore, the method for manufacturing a semiconductor device according to some implementations of the present disclosure may stably make sure of the thickness of the substrate 100 in the vertical direction DR3 by preventing the substrate 100 from being excessively etched while the lower surface 100b of the substrate 100 is being etched.

In the semiconductor device according to some implementations of the present disclosure, which is manufactured by the aforementioned manufacturing method, each of the upper surface and the lower surface of the first through-via 130 formed by replacing the second sacrificial layer 20 may be formed on the same plane as each of the upper surface 100a and the lower surface 100b of the substrate 100. In addition, the semiconductor device according to some implementations of the present disclosure may have a slope profile of a sidewall in which the width of the first through-via 130 in the second horizontal direction DR2 is continuously reduced as the first through-via 130 becomes adjacent to the lower surface 100b of the substrate 100. That is, since the width of the upper surface of the first through-via 130 connected to the second through-via 140 is relatively large, the second through-via 140 may be stably connected to the first through-via 130.

Hereinafter, a method for manufacturing a semiconductor device according to some implementations of the present disclosure will be described with reference to FIGS. 43 to 44. The following description will be based on differences from the method for manufacturing the semiconductor device shown in FIGS. 5 to 42.

Figure 43:
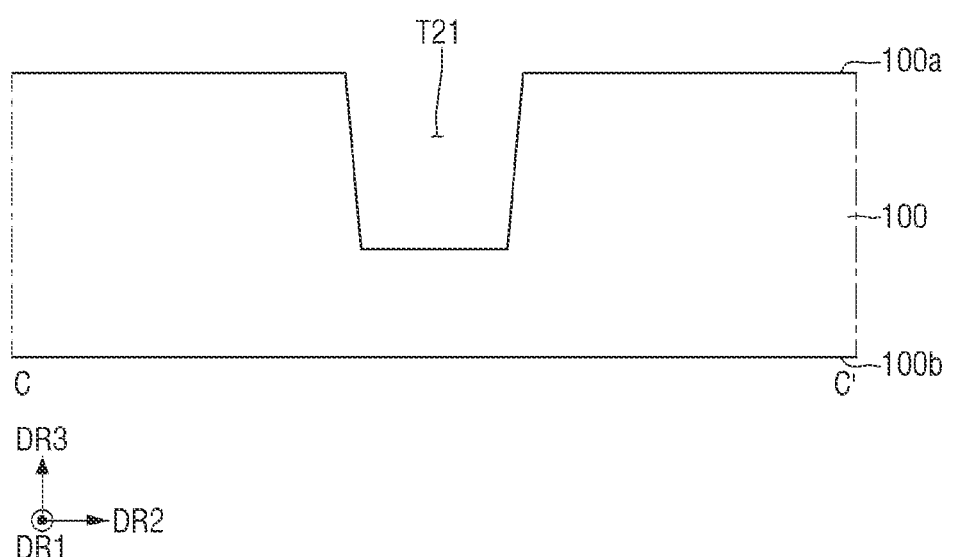
FIGS. 43 and 44 are views illustrating intermediate steps to describe a method for manufacturing a semiconductor device according to some implementations of the present disclosure.
Figure 44:
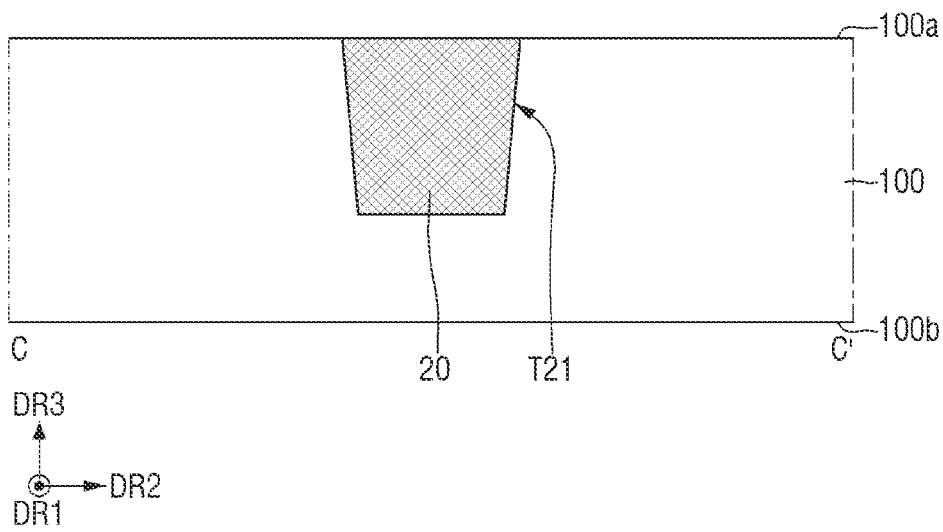

FIGS. 43 and 44 are views illustrating intermediate steps to describe a method for manufacturing a semiconductor device according to some implementations of the present disclosure.

Referring to FIG. 43, a first trench T21 may be formed inside the substrate 100. The first trench T21 may extend from the upper surface 100a of the substrate 100 to the inside of the substrate 100. Sidewalls and a bottom surface of the first trench T21 may be defined by the substrate 100. For example, a depth of the first trench T21 in the vertical direction DR3 may be smaller than that of the first trench T1 in the vertical direction DR3 shown in FIG. 7.

Referring to FIG. 44, the second sacrificial layer 20 may be formed inside the first trench T21. The second sacrificial layer 20 may completely fill the inside of the first trench T21. For example, the upper surface of the second sacrificial layer 20 may be formed on the same plane as the upper surface 100a of the substrate 100. Subsequently, after the manufacturing process shown in FIGS. 9 to 42 is performed, the semiconductor device shown in FIGS. 2 to 4 may be manufactured.

Hereinafter, a semiconductor device according to some implementations of the present disclosure will be described with reference to FIG. 45. The following description will be based on differences from the semiconductor device shown in FIGS. 1 to 4.

Figure 45:
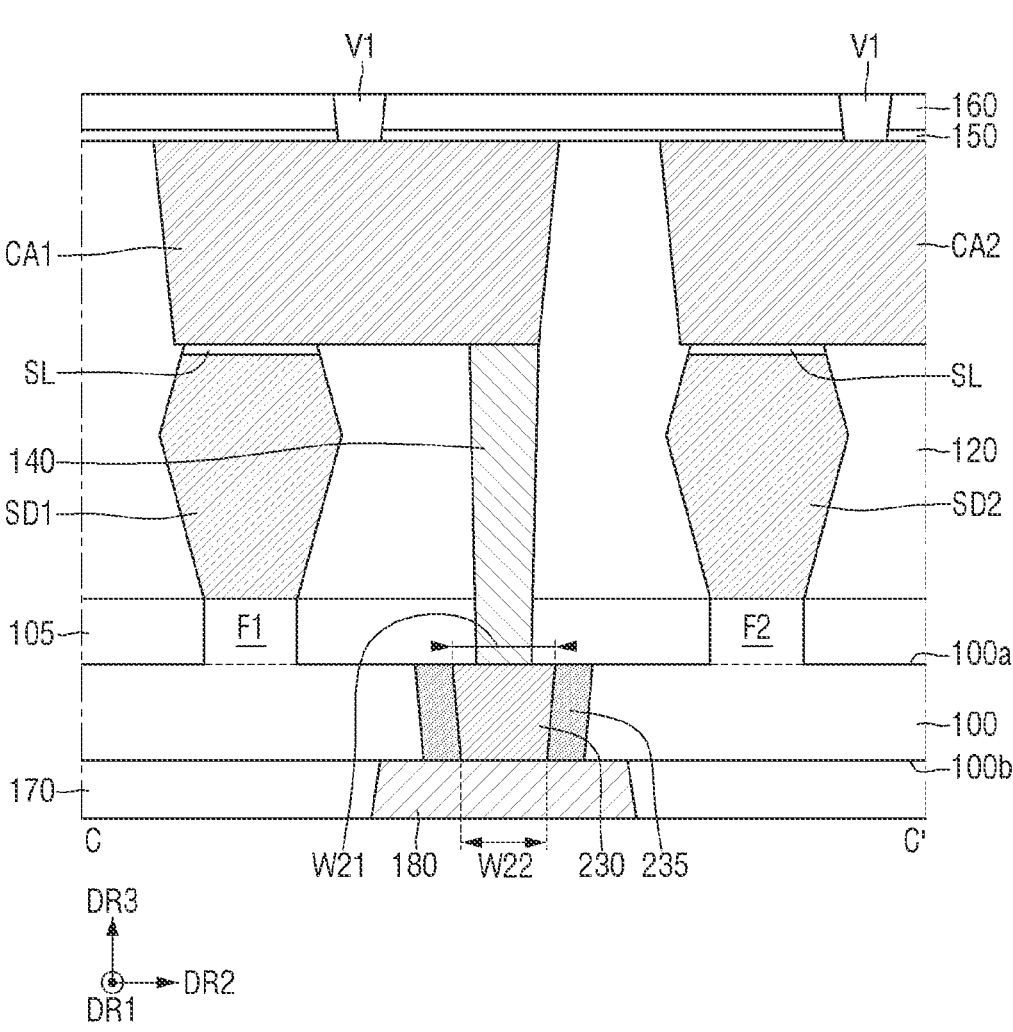
FIG. 45 is a cross-sectional view illustrating a semiconductor device according to some implementations of the present disclosure.

FIG. 45 is a cross-sectional view illustrating a semiconductor device according to some implementations of the present disclosure.

Referring to FIG. 45, in the semiconductor device according to some implementations of the present disclosure, an insulating liner 235 may be disposed between the substrate 100 and a first through-via 230. For example, a thickness of the insulating liner 235 in the second horizontal direction DR2 may be greater than the thickness of the insulating liner 135 in the second horizontal direction DR2, which is shown in FIG. 4.

For example, the insulating liner 235 may be formed to be conformal. For example, the insulating liner 235 may extend from a lower surface to an upper surface of the first through-via 230. That is, an upper surface of the insulating liner 235 may be formed on the same plane as the upper surface of the first through-via 230. In addition, a lower surface of the insulating liner 235 may be formed on the same plane as the lower surface of the first through-via 230.

For example, the first through-via 230 may be electrically insulated from the substrate 100 by the insulating liner 235. For example, the upper surface of the insulating liner 235 may be in contact with the field insulating layer 105. In addition, the lower surface of the insulating liner 235 may be in contact with the lower wiring pattern 180. The insulating liner 235 may include at least one of, for example, silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), or their combination, but the present disclosure is not limited thereto.

For example, a width W21 of the upper surface of the first through-via 230 in the second horizontal direction DR2 may be greater than a width W22 of the lower surface of the first through-via 230 in the second horizontal direction DR2. The width of the first through-via 230 in the second horizontal direction DR2 may be continuously reduced as the first through-via 230 becomes adjacent to the lower surface 100b of the substrate 100. For example, a sidewall of the first through-via 230 may have a constant slope profile.

Hereinafter, a method for manufacturing a semiconductor device according to some implementations of the present disclosure will be described with reference to FIGS. 45 to 49. The following description will be based on differences from the method for manufacturing the semiconductor devices shown in FIGS. 5 to 42.

FIGS. 46 to 49 are views illustrating intermediate steps to describe a method for manufacturing a semiconductor device according to some implementations of the present disclosure.

Figure 46:
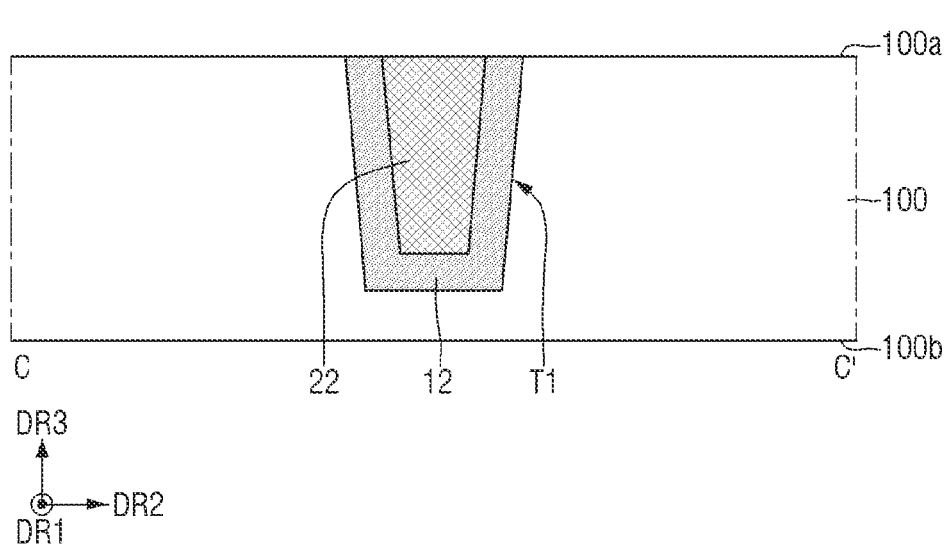

Referring to FIG. 46, the first trench T1 may be formed inside the substrate 100. The first trench T1 may extend from the upper surface 100a of the substrate 100 to the inside of the substrate 100. Sidewalls and a bottom surface of the first trench T1 may be defined by the substrate 100. Subsequently, a first sacrificial layer 12 may be formed along the sidewalls and the bottom surface of the first trench T1. Then, a second sacrificial layer 22 may be formed on the first sacrificial layer 12 inside the first trench T1. The second sacrificial layer 22 may completely fill the inside of the first trench T1.

Figure 47:
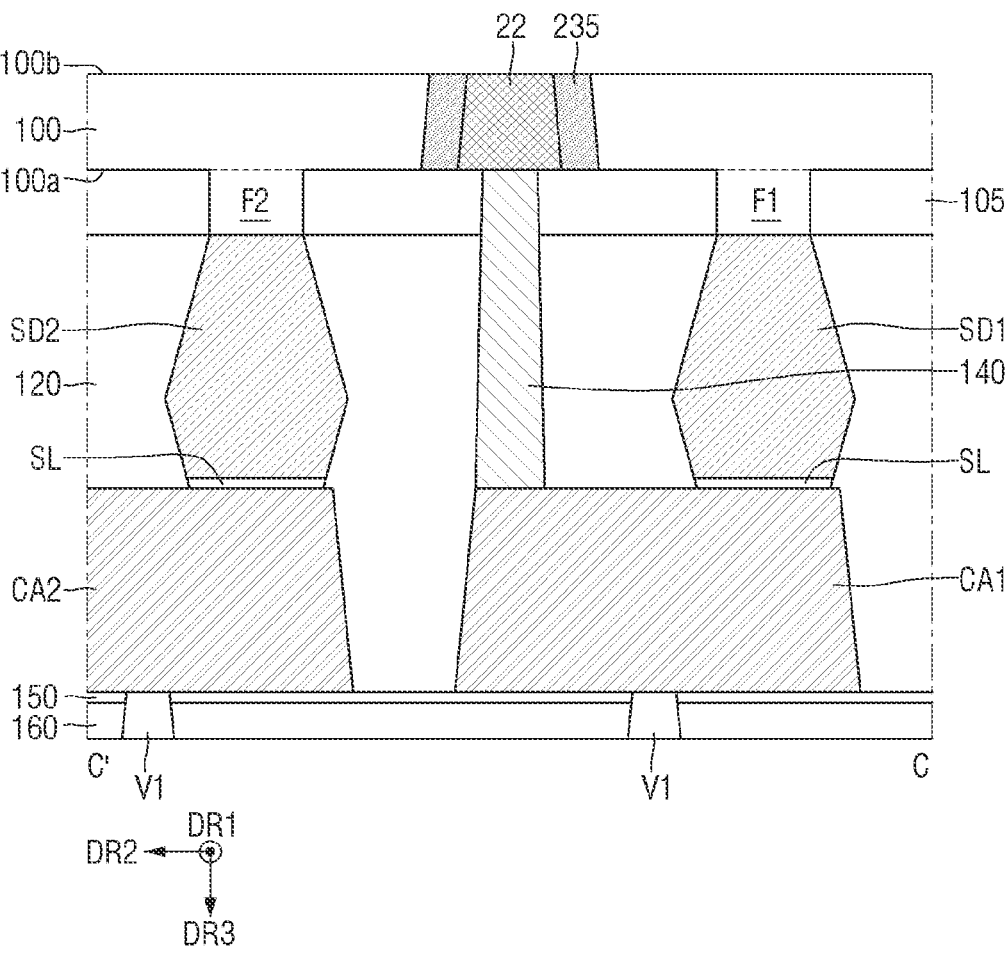

Referring to FIG. 47, upper and lower portions may be inverted after the manufacturing process shown in FIGS. 9 to 35 is performed. Then, a portion of the substrate 100 and a portion of the first sacrificial layer (12 of FIG. 46) may be etched through a planarization process to expose the second sacrificial layer 22. For example, while a portion of the substrate 100 and a portion of the first sacrificial layer (12 of FIG. 46) are being etched, a time point at which a surface of the second sacrificial layer 22 is exposed may be used as a time point at which the etching of the substrate 100 is stopped. For example, the lower surface 100b of the substrate 100 and the exposed surface of the second sacrificial layer 22 may be formed on the same plane. After the planarization process is completed, the remaining first sacrificial layer (12 of FIG. 46) may be defined as the insulating liner 235.

Figure 48:
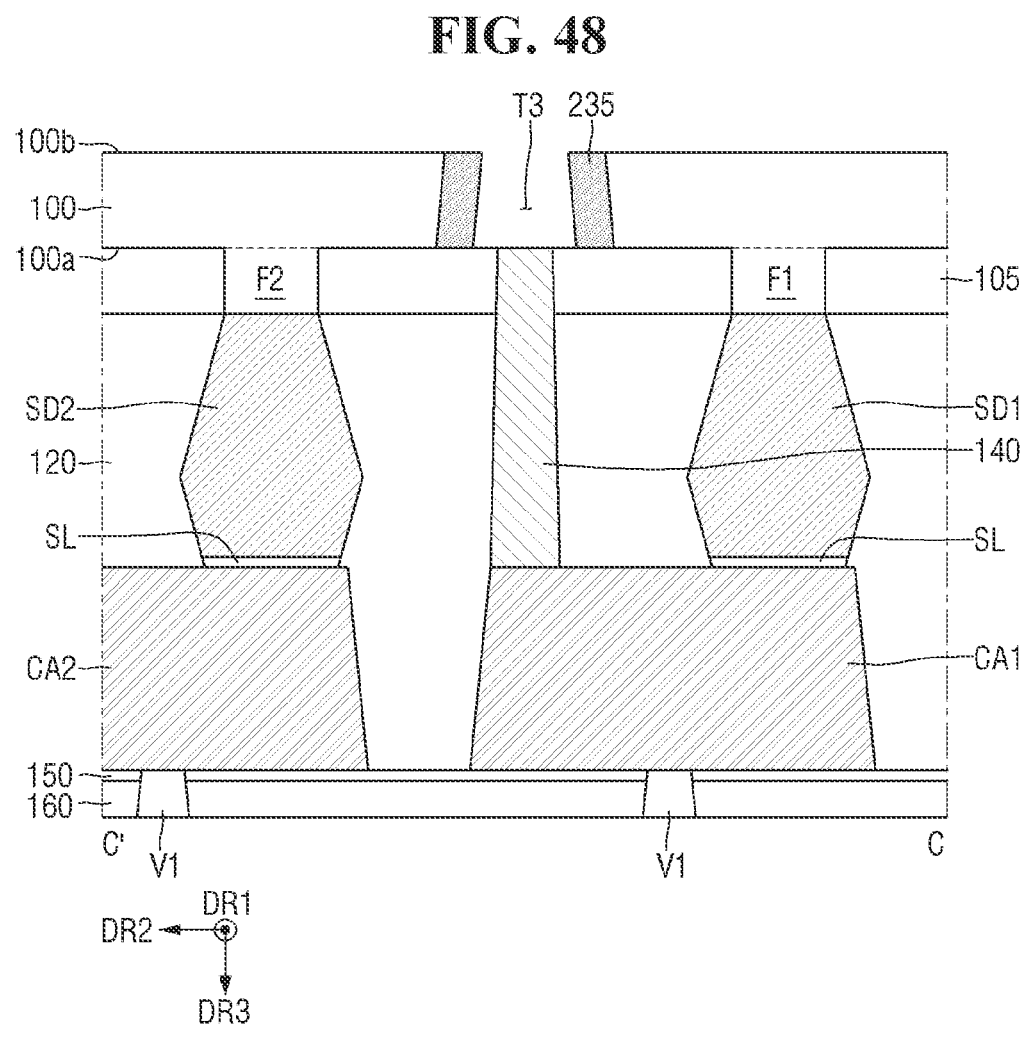

Referring to FIG. 48, the second sacrificial layer (22 of FIG. 47) may be etched. Therefore, a third trench T3 may be formed between the insulating liners 235 inside the substrate 100. For example, the field insulating layer 105 and the second through-via 140 may be exposed through a bottom surface of the third trench T3.

Figure 49:
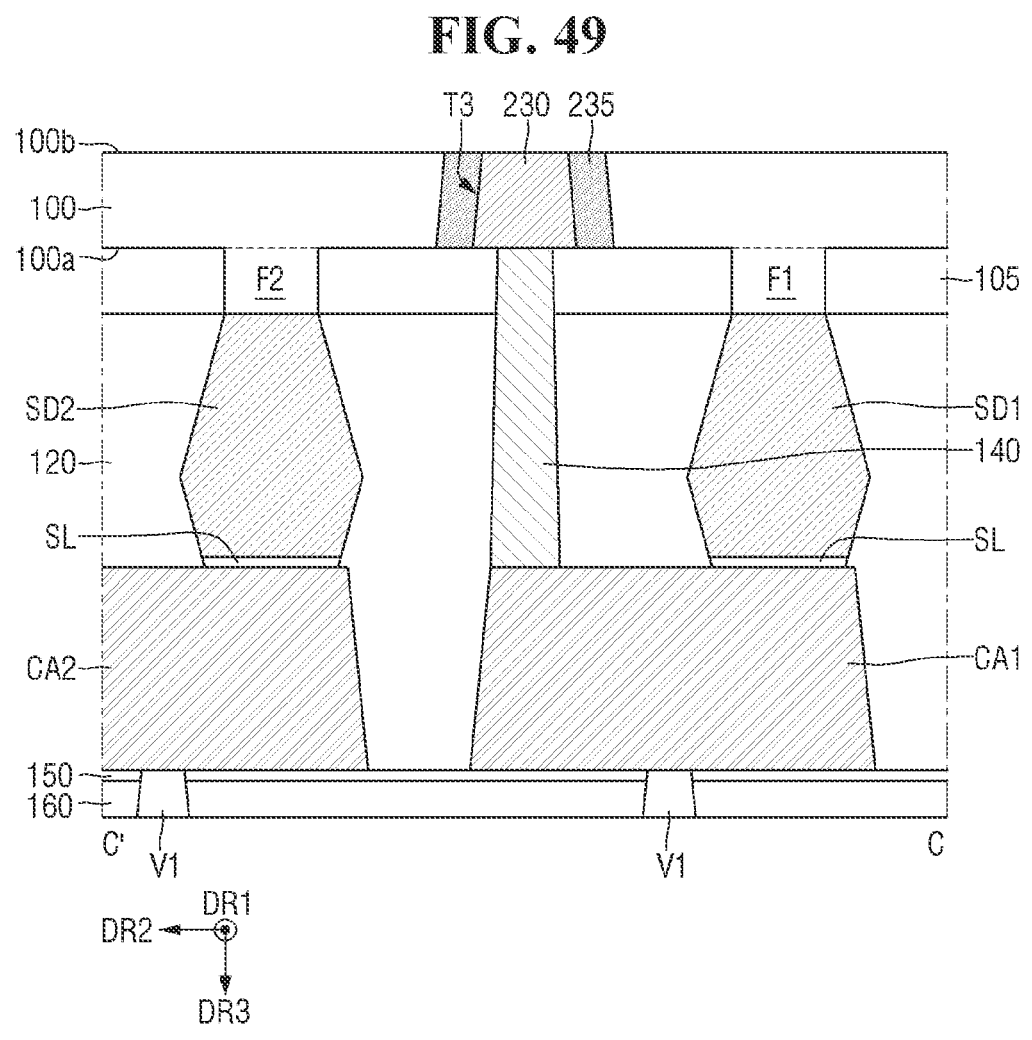

Referring to FIG. 49, the first through-via 230 may be formed to fill the inside of the third trench T3 on the insulating liner 235. For example, the first through-via 230 may be also formed on the lower surface 100b of the substrate 100. Then, the lower surface 100b of the substrate 100 and the insulating liner 235 may be exposed through the planarization process. Therefore, the exposed surface of the first through-via 230, the exposed surface of the insulating liner 235, and the lower surface 100b of the substrate 100 may be formed on the same plane. The first through-via 230 may be in contact with the second through-via 240.

Referring to FIG. 45, the lower interlayer insulating layer 170 may be formed on each of the exposed surface of the first through-via 230, the exposed surface of the insulating liner 235, and the lower surface 100b of the substrate 100. Subsequently, the lower wiring pattern 180 may be formed inside the lower interlayer insulating layer 170. The lower wiring pattern 180 may be connected to the first through-via 230. Then, the semiconductor device shown in FIG. 45 may be manufactured by inversion of the upper and lower portions.

Hereinafter, a semiconductor device according to some implementations of the present disclosure will be described with reference to FIGS. 50 to 52. The following description will be based on differences from the semiconductor devices shown in FIGS. 1 to 4.

Figure 50:
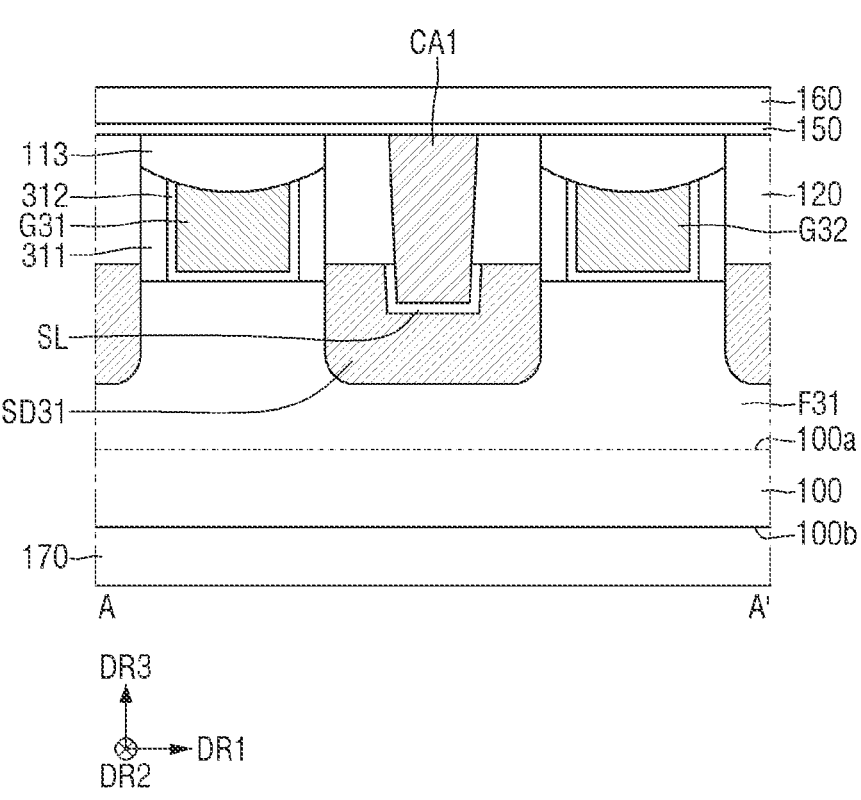
Figure 51:
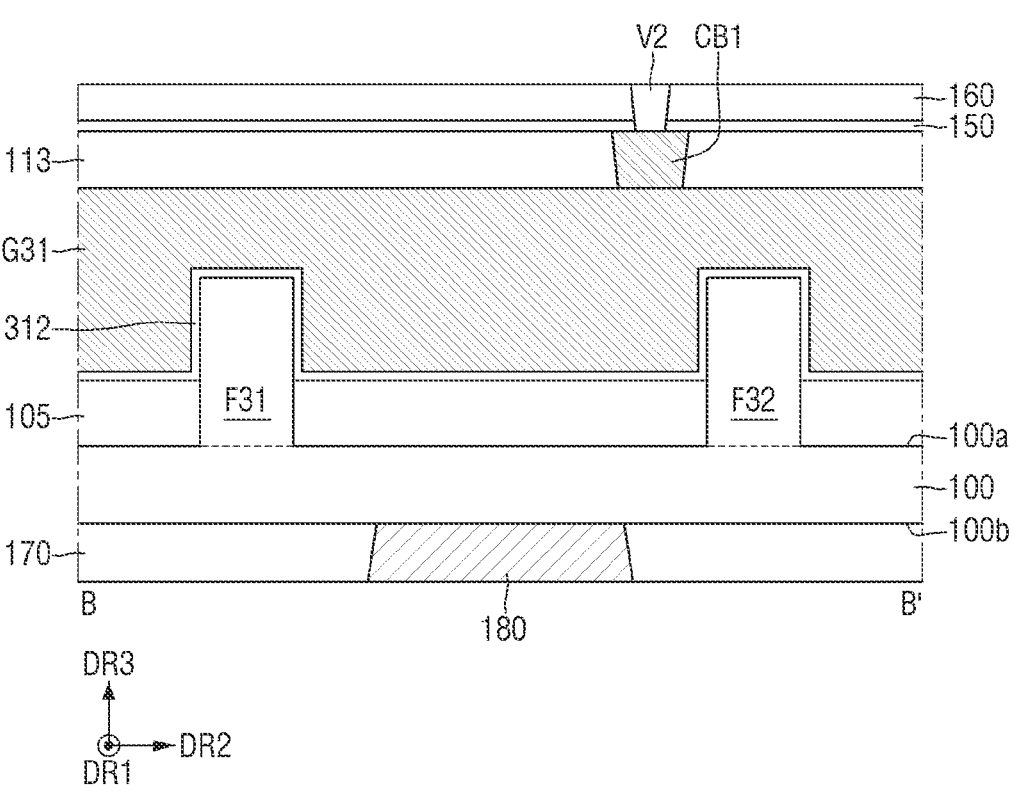
Figure 52:
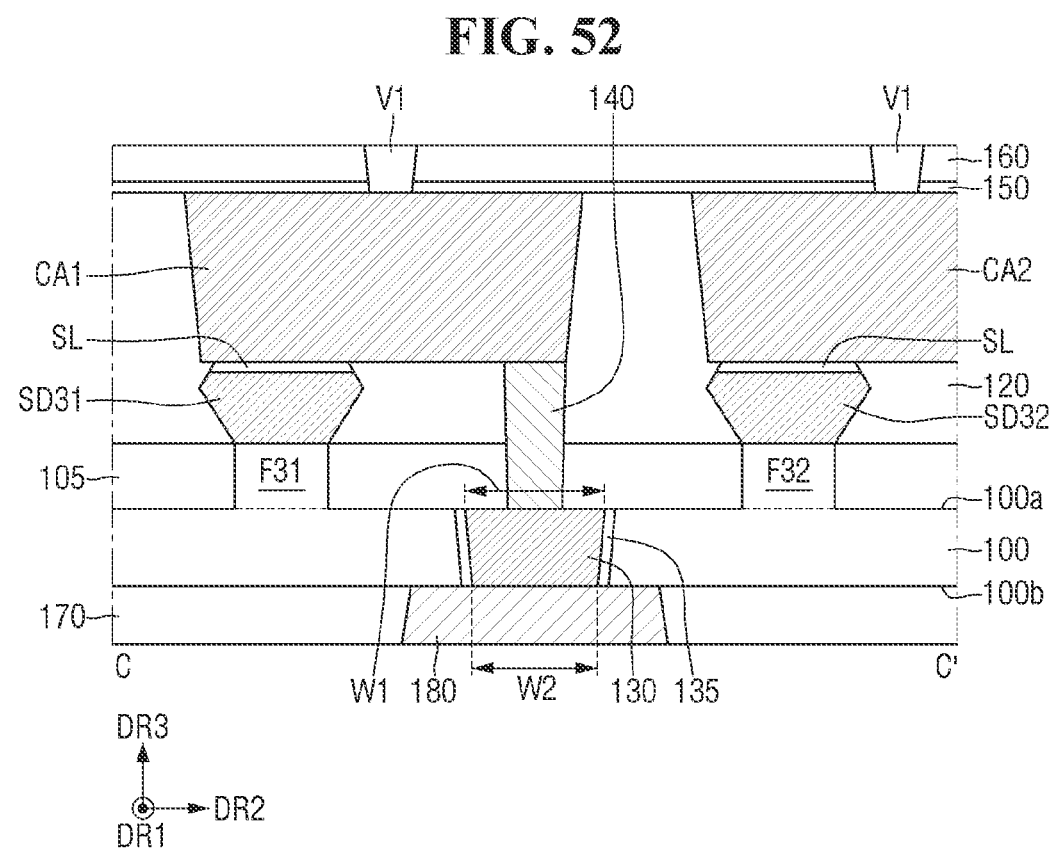

FIGS. 50 to 52 are views illustrating intermediate steps to describe a method for manufacturing a semiconductor device according to some implementations of the present disclosure.

Referring to FIGS. 50 to 52, the semiconductor device according to some implementations of the present disclosure may include a fin-type transistor (FinFET). For example, the semiconductor device according to some implementations of the present disclosure may include a substrate 100, a field insulating layer 105, first and second active patterns F31 and F32, first and second gate electrodes G31 and G32, a gate spacer 311, a gate insulating layer 312, a capping pattern 113, first and second source/drain regions SD31 and SD32, a first upper interlayer insulating layer 120, a first through-via 130, an insulating liner 135, a second through-via 140, first and second source/drain contacts CA1 and CA2, a silicide layer SL, a first gate contact CB1, an etch stop layer 150, a second upper interlayer insulating layer 160, first and second vias V1 and V2, a lower interlayer insulating layer 170, and a lower wiring pattern 180. Hereinafter, the description of the elements described with reference to FIGS. 1 to 4 will be omitted.

Each of the first active pattern F31 and the second active pattern F32 may extend in the first horizontal direction DR1 on the upper surface 100a of the substrate 100. The second active pattern F32 may be spaced apart from the first active pattern F31 in the second horizontal direction DR2. The first gate electrode G31 may extend in the second horizontal direction DR2 on the first active pattern F31, the second active pattern F32, and the field insulating layer 105. The second gate electrode G32 may extend in the second horizontal direction DR2 on the first active pattern F31, the second active pattern F32, and the field insulating layer 105. The second gate electrode G32 may be spaced apart from the first gate electrode G31 in the first horizontal direction DR1. The gate spacer 311 may extend in the second horizontal direction DR2 along both sidewalls of the first gate electrode G31 on the first active pattern F31, the second active pattern F32 and the field insulating layer 105. The gate spacer 311 may extend in the second horizontal direction DR2 along both sidewalls of the second gate electrode G32 on the first active pattern F31, the second active pattern F32 and the field insulating layer 105.

The gate insulating layer 312 may be disposed between each of the first and second gate electrodes G31 and G32 and the first active pattern F31. The gate insulating layer 312 may be disposed between each of the first and second gate electrodes G31 and G32 and the second active pattern F32. The gate insulating layer 312 may be disposed between each of the first and second gate electrodes G31 and G32 and the field insulating layer 105. The gate insulating layer 312 may be disposed between each of the first and second gate electrodes G31 and G32 and the gate spacer 311. The first source/drain region SD31 may be disposed on both sides of each of the first gate electrode G31 and the second gate electrode G32 on the first active pattern F31. The second source/drain region SD32 may be disposed on both sides of each of the first gate electrode G31 and the second gate electrode G32 on the second active pattern F32.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

Although the implementations according to the present disclosure have been described with reference to the accompanying drawings, it will be apparent to those skilled in the art that the present disclosure can be manufactured in various forms without being limited to the above-described implementations and can be embodied in other specific forms without departing from technical spirits and essential characteristics of the present disclosure. Thus, the above implementations are to be considered in all respects as illustrative and not restrictive.

What is claimed is:

1. A semiconductor device comprising:
a substrate;
a first active pattern extending in a first horizontal direction on an upper surface of the substrate;
a second active pattern extending in the first horizontal direction on the upper surface of the substrate, the second active pattern spaced apart from the first active pattern in a second horizontal direction different from the first horizontal direction;
a gate electrode extending in the second horizontal direction on the first and second active patterns;
a source/drain region disposed on at least one side of the gate electrode on the first active pattern;
a first through-via disposed inside the substrate between the first active pattern and the second active pattern, the first through-via spaced apart from each of the first and second active patterns in the second horizontal direction, an upper surface of the first through-via formed on the same plane as the upper surface of the substrate, a lower surface of the first through-via formed on the same plane as a lower surface of the substrate;
an upper interlayer insulating layer covering the source/drain region; and
a second through-via connected to the first through-via by passing through the upper interlayer insulating layer in a vertical direction, the second through-via spaced apart from the source/drain region in the second horizontal direction,
wherein a width of the first through-via in the second horizontal direction is continuously reduced as the first through-via becomes adjacent to the lower surface of the substrate.

2. The semiconductor device of claim 1, further comprising an insulating liner disposed between the substrate and the first through-via.

3. The semiconductor device of claim 2, wherein an upper surface of the insulating liner is formed on the same plane as the upper surface of the first through-via, and
a lower surface of the insulating liner is formed on the same plane as the lower surface of the first through-via.

4. The semiconductor device of claim 1, wherein the second through-via is spaced apart from the gate electrode in the first horizontal direction.

5. The semiconductor device of claim 1, further comprising a source/drain contact disposed on one side of the gate electrode inside the upper interlayer insulating layer, the source/drain contact connecting the source/drain region with the second through-via.

6. The semiconductor device of claim 5, wherein the second through-via overlaps the source/drain contact in the vertical direction.

7. The semiconductor device of claim 1, further comprising a field insulating layer surrounding sidewalls of the first and second active patterns between the upper surface of the substrate and the upper interlayer insulating layer, the field insulating layer being in contact with at least a portion of the upper surface of the first through-via.

8. The semiconductor device of claim 1, wherein a width of the second through-via in the second horizontal direction is continuously reduced as the second through-via becomes adjacent to the upper surface of the first through-via.

9. The semiconductor device of claim 1, further comprising:
a lower interlayer insulating layer disposed on the lower surface of the substrate; and
a lower wiring pattern disposed inside the lower interlayer insulating layer, the lower wiring pattern connected to the first through-via.

10. The semiconductor device of claim 9, wherein a width of the lower wiring pattern in the second horizontal direction is continuously reduced as the lower wiring pattern becomes adjacent to the lower surface of the first through-via.

11. The semiconductor device of claim 1, further comprising a plurality of nanosheets stacked to be spaced apart from each other in the vertical direction on the first active pattern, the plurality of nanosheets being surrounded by the gate electrode.

12. A semiconductor device comprising:
a substrate;
an active pattern extending in a first horizontal direction on an upper surface of the substrate;
a field insulating layer surrounding a sidewall of the active pattern on the upper surface of the substrate;
a gate electrode extending in a second horizontal direction different from the first horizontal direction on the active pattern;
a first through-via disposed inside the substrate on one side of the active pattern, the first through-via spaced apart from the active pattern in the second horizontal direction, an upper surface of the first through-via formed on the same plane as the upper surface of the substrate, a lower surface of the first through-via formed on the same plane as a lower surface of the substrate;
an insulating liner disposed between the substrate and the first through-via;
an upper interlayer insulating layer disposed on the field insulating layer;
a second through-via connected to the first through-via by passing through the field insulating layer and the upper interlayer insulating layer in a vertical direction;

a lower interlayer insulating layer disposed on the lower surface of the substrate; and a lower wiring pattern disposed inside the lower interlayer insulating layer, the lower wiring pattern connected to the first through-via, wherein a width of the first through-via in the second horizontal direction is continuously reduced as the first through-via becomes adjacent to the lower surface of the substrate.

13. The semiconductor device of claim 12, wherein an upper surface of the insulating liner is formed on the same plane as the upper surface of the first through-via, and a lower surface of the insulating liner is formed on the same plane as the lower surface of the first through-via.

14. The semiconductor device of claim 12, wherein an upper surface of the insulating liner is in contact with the field insulating layer, and a lower surface of the insulating liner is in contact with the lower wiring pattern.

15. The semiconductor device of claim 12, further comprising:

a source/drain region disposed on at least one side of the gate electrode on the active pattern, the source/drain region spaced apart from the second through-via in the second horizontal direction; and a source/drain contact disposed on one side of the gate electrode inside the upper interlayer insulating layer, the source/drain contact connecting the source/drain region with the second through-via.

16. The semiconductor device of claim 15, wherein an upper surface of the source/drain contact is formed on the same plane as an upper surface of the upper interlayer insulating layer.

17. The semiconductor device of claim 12, wherein the second through-via is spaced apart from the gate electrode in the first horizontal direction.

18. The semiconductor device of claim 12, wherein a width of the lower wiring pattern in the second horizontal direction is continuously reduced as the lower wiring pattern becomes adjacent to the lower surface of the first through-via.

19. The semiconductor device of claim 12, further comprising a plurality of nanosheets stacked to be spaced apart from each other in the vertical direction on the active pattern, the plurality of nanosheets being surrounded by the gate electrode.

20. A semiconductor device comprising:

a substrate;

a first active pattern extending in a first horizontal direction on an upper surface of the substrate;

a second active pattern extending in the first horizontal direction on the upper surface of the substrate, the second active pattern spaced apart from the first active pattern in a second horizontal direction different from the first horizontal direction;

a field insulating layer surrounding a sidewall of each of the first and second active patterns on the upper surface of the substrate;

a first plurality of nanosheets stacked to be spaced apart from each other in a vertical direction on the first active pattern;

a second plurality of nanosheets stacked to be spaced apart from each other in the vertical direction on the second active pattern;

a gate electrode extending in the second horizontal direction on the first and second active patterns, the gate electrode surrounding each of the first and second plurality of nanosheets;

a first source/drain region disposed on at least one side of the gate electrode on the first active pattern;

a second source/drain region disposed on at least one side of the gate electrode on the second active pattern;

a first through-via disposed inside the substrate between the first active pattern and the second active pattern, the first through-via spaced apart from each of the first and second active patterns in the second horizontal direction, an upper surface of the first through-via formed on the same plane as the upper surface of the substrate, a lower surface of the first through-via formed on the same plane as a lower surface of the substrate;

an insulating liner disposed between the substrate and the first through-via, an upper surface of the insulating liner formed on the same plane as the upper surface of the first through-via, a lower surface of the insulating liner formed on the same plane as the lower surface of the first through-via;

an upper interlayer insulating layer covering each of the first and second source/drain regions on the field insulating layer;

a second through-via connected to the first through-via by passing through the field insulating layer and the upper interlayer insulating layer in the vertical direction, the second through-via spaced apart from each of the first and second source/drain regions in the second horizontal direction;

a source/drain contact disposed on one side of the gate electrode inside the upper interlayer insulating layer, the source/drain contact connecting the first source/drain region with the second through-via;

a lower interlayer insulating layer disposed on the lower surface of the substrate; and a lower wiring pattern disposed inside the lower interlayer insulating layer, the lower wiring pattern connected to the first through-via, wherein a width of the first through-via in the second horizontal direction is continuously reduced as the first through-via becomes adjacent to the lower surface of the substrate, and a width of the lower wiring pattern in the second horizontal direction is continuously reduced as the lower wiring pattern becomes adjacent to the lower surface of the first through-via.

* * * * *